(12) United States Patent
Kernahan et al.

(10) Patent No.: US 7,609,185 B2
(45) Date of Patent: Oct. 27, 2009

(54) METHODS OF USING PREDICTIVE ANALOG TO DIGITAL CONVERTERS

(75) Inventors: Kent Kernahan, Cupertino, CA (US); Xuecheng Jin, Palo Alto, CA (US); Ping Lo, Santa Clara, CA (US); Ion E. Opris, San Jose, CA (US); Sorin Andrei Spanoche, Santa Clara, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 12/143,708

(22) Filed: Jun. 20, 2008

(65) Prior Publication Data

US 2008/0297381 A1    Dec. 4, 2008

Related U.S. Application Data

(62) Division of application No. 11/316,636, filed on Dec. 21, 2005, now Pat. No. 7,405,689.

(60) Provisional application No. 60/641,844, filed on Jan. 5, 2005.

(51) Int. Cl.
*H03M 1/10* (2006.01)
(52) U.S. Cl. .................................................. 341/120
(58) Field of Classification Search .................. 341/50, 341/51, 120, 122, 155, 156, 144; 375/216, 375/356, 240.16
See application file for complete search history.

(56) References Cited

U.S. PATENT DOCUMENTS

| | | | | |
|---|---|---|---|---|
| 4,308,524 | A  * | 12/1981 | Harrison et al. | 341/122 |
| 5,509,035 | A  * | 4/1996 | Teidemann et al. | 375/356 |
| 5,870,427 | A  * | 2/1999 | Tiedemann et al. | 375/216 |
| 6,801,146 | B2 * | 10/2004 | Kernahan et al. | 341/122 |
| 2006/0280249 | A1* | 12/2006 | Poon | 375/240.16 |

* cited by examiner

*Primary Examiner*—Jean B Jeanglaude
(74) *Attorney, Agent, or Firm*—Michael W. Caldwell

(57) ABSTRACT

Methods are disclosed for performing analog to digital signal conversion in shorter time and/or with less power consumption. A predictive guess is supplied as a digital first signal. The digital first signal is converted (D/A) to a counterpart, analog guess signal. A comparison is made between the analog guess signal and a received, analog input sample signal. The result of the comparison is used to improve on the initially supplied guess in a next cycle. Fewer cycles and less power is consumed if the initial guess is within a certain range of the actual magnitude of the analog input sample signal.

15 Claims, 17 Drawing Sheets

| Step | P | $V_{IN} > P$? | OUTFLG | Flag Sequence | Correction | Next P |
|---|---|---|---|---|---|---|
| 1 | 742 | FALSE | H | H | -1 | 741 |
| 2 | 741 | TRUE | L | HL | Stop | N/A |

FINAL RESULT: 0

FIG 5A

| Step | P | $V_{IN} > P$? | OUTFLG | Flag Sequence | Correction | Next P |
|---|---|---|---|---|---|---|
| 1 | 742 | TRUE | L | L | +2 | 744 |
| 2 | 744 | TRUE | L | LL | +4 | 748 |
| 3 | 748 | TRUE | L | LLL | +2 | 750 |
| 4 | 750 | FALSE | H | LLLH | -1 | 749 |
| 5 | 749 | FALSE | H | LLLHH | Stop | N/A |

FINAL RESULT: 7

FIG 5B

| Step | P | $V_{IN} > P$? | OUTFLG | Flag Sequence | Correction | Next P |
|---|---|---|---|---|---|---|
| 1 | 742 | FALSE | | | -1 | 741 |
| 2 | 741 | FALSE | | | -2 | 739 |
| 3 | 739 | FALSE | | | -4 | 735 |
| 4 | 735 | FALSE | | | -2 | 733 |
| 5 | 733 | FALSE | | | -1 | 732 |
| 6 | 732 | FALSE | | | Under | N/A |

FINAL RESULT: 7

METHODS OF USING PREDICTIVE ANALOG TO DIGITAL CONVERTERS

CROSS REFERENCES TO RELATED APPLICATIONS

This divisional application claims priority from the commonly-owed parent U.S. patent application Ser. No. 11/316,636, titled PREDICTIVE ANALOG TO DIGITAL CONVERTERS AND METHODS OF USING, filed 21 Dec. 2005, by Kernahan, et al. In addition, priority is claimed from the Provisional Application Ser. No. 60/641,844 filed Jan. 5, 2005 by Kernahan, et al, titled PREDICTIVE ANALOG TO DIGITAL CONVERTER AND METHOD OF USING, which is incorporated herein in its entirety. Also, the commonly-owed U.S. patent application, Ser. No. 10/295,449 filed Nov. 14, 2002 by Kent Kernahan, et al, and entitled, "SWITCHING POWER CONVERTER", which application issued Oct. 5, 2004 as U.S. Pat. No. 6,801,146, is incorporated herein in its entirety.

BACKGROUND

Analog to digital converters ("ADC"s) are used in systems wherein a digital representation of an analog value is needed. A problem with some ADC solutions offered heretofore is the high power consumed by conversion. Disclosed here is a novel design for and method of using successive approximations in an analog to digital converter such that time and/or power for conversion is opportunistically reduced.

SUMMARY

This section summarizes some features of the present disclosure. Other features are described in subsequent sections.

Some embodiments described herein use circuitry described in the aforementioned U.S. patent application Ser. No. 10/295,449, now U.S. Pat. No. 6,801,146 issued to Kernahan et al. on Oct. 5, 2004. In such embodiments the present disclosure corresponds to ADC 1206 shown in FIGS. 12A-12D of said U.S. patent application Ser. No. 10/295,449 The method of the present disclosure may be seen as interacting with REG 1204. The present disclosure of invention is not limited to the circuitry of U.S. Pat. No. 6,801,146, or to software programmable implementations per se.

The conventional successive approximation register (SAR) based analog to digital converter, which is well known in the industry, starts at its full scale midpoint and performs a binary search that searches for the final digital conversion result one bit at a time, thus requiring as many comparisons as there are bits in the full digital result signal. In the very first iteration following the midpoint start and first comparison, the conventional SAR will generally do one of two things: step up from the midpoint by a quarter scale magnitude (+FS/4) or step down by a quarter scale magnitude (−FS/4). In the next successive iteration, the conventional SAR will generally do one of two things: step up by an eighth of scale magnitude (+FS/8) or step down by an eighth of scale magnitude (−FS/8). This continues until all output bits are resolved, one after the next. By contrast, and in accordance with the present invention, a method is provided wherein the final value of the digital result is assumed to be within a certain vicinity of a supplied estimation such that in the very first iteration following an other-than-midpoint start (a guessed start), the analog-to-digital conversion process generally does one of two things: steps up in the positive direction by a distance that is substantially less than a quarter scale magnitude (PositiveStep1<+FS/4) or steps down in the negative direction by a step distance whose absolute value is substantially less than a quarter scale magnitude (|NegativeStep1|<FS/4). In other words, if the initially supplied estimate is in fact close to the actual conversion result, the method will converge to the correct answer more quickly, with a fewer number of steps, because it bounds the final answer into a smaller range than does the conventional approach and therefore needs a fewer number of comparisons to home in on the final result than are required by the conventional, binary search method. A homing-in or search pattern in accordance with the method begins at the estimated value and, rather than using a binary search, it searches in accordance with a convergence pattern that closes in from the assumed answer towards the correct answer in a fewer number of steps. Thus, when a voltage to be measured is close to the estimated voltage level, the conversion will determine the correct answer with only a few compare and adjust cycles. More specifically, if the correct digital answer has 10 bits of precision, the methods described here can converge on the correct answer by using fewer than 10 comparison steps, for example, no more than 5 comparison steps in one embodiment.

In some embodiments, a control system estimates a certain number of the most significant bits of the conversion result. If the estimate of the most significant bits differs from the actual value by more than a predetermined error threshold, a full conversion of the conventional binary kind is initiated and in some embodiments a second ADC is employed to convert during the next time frame. In another embodiment there is a plurality of converters connected in parallel such that more conversions may be made per unit of time. In one embodiment voltage data is taken at regular intervals so that good estimates will be available for succeeding conversions and the SAR consumes little energy between conversions.

Other aspects of the disclosure will become apparent from the below detailed description.

BRIEF DESCRIPTION OF THE DRAWINGS

The below detailed description section makes reference to the accompanying drawings, in which:

FIGS. 5A, 5B and 5C respectively provide a series of examples of the method of FIGS. 4A-4B;

FIGS. 12A, 12B and 12C disclose scenarios of out of range and normal conversion for the FIG. 9A embodiment; and FIGS. 13A and 13B disclose scenarios of out of range and normal conversion for FIG. 9B.

DETAILED DESCRIPTION

Table 1 provides some Acronyms, and Abbreviations as may be used in the detailed description.

TABLE 1

| | |
|---|---|
| DAC | Digital to Analog Converter |
| DAS | Data Acquisition System |
| dX | Change in value of X, where X may be any parameter such as that representing current (I), voltage (V), Tp, Ts, etc. |
| FS | Full scale (maximum) value of an ADC or DAC |
| REG | Regulation system, which includes REG_Eng, REG_Sch, SC, SV, Variables and interfaces to DPC, DAS, NFETDVR and SYS, as described in aforementioned U.S. patent application No. 10/295,449 and U.S. Pat. No. 6,801,146. |
| SYS | Microcontroller-based system control such as described for example in the aforementioned U.S. patent application no. 10/295,449 and U.S. Pat. No. 6,801,146 |
| V(n) | Voltage $V_{in}$ sampled in a present time slot, n. |
| $V_{est}$(n + 1) | Estimate of $V_{in}$ for the next time slot, n + 1. |
| V(n − 1) | Voltage of $V_{in}$ from the previous time slot. |
| $V_{in}$ | Voltage which DAS converts to a digital representation. |
| Vos | Offset voltage introduced into a DAC |
| 1LSB | The voltage equivalent of one least significant bit of an ADC or DAC. |

Figure 1:
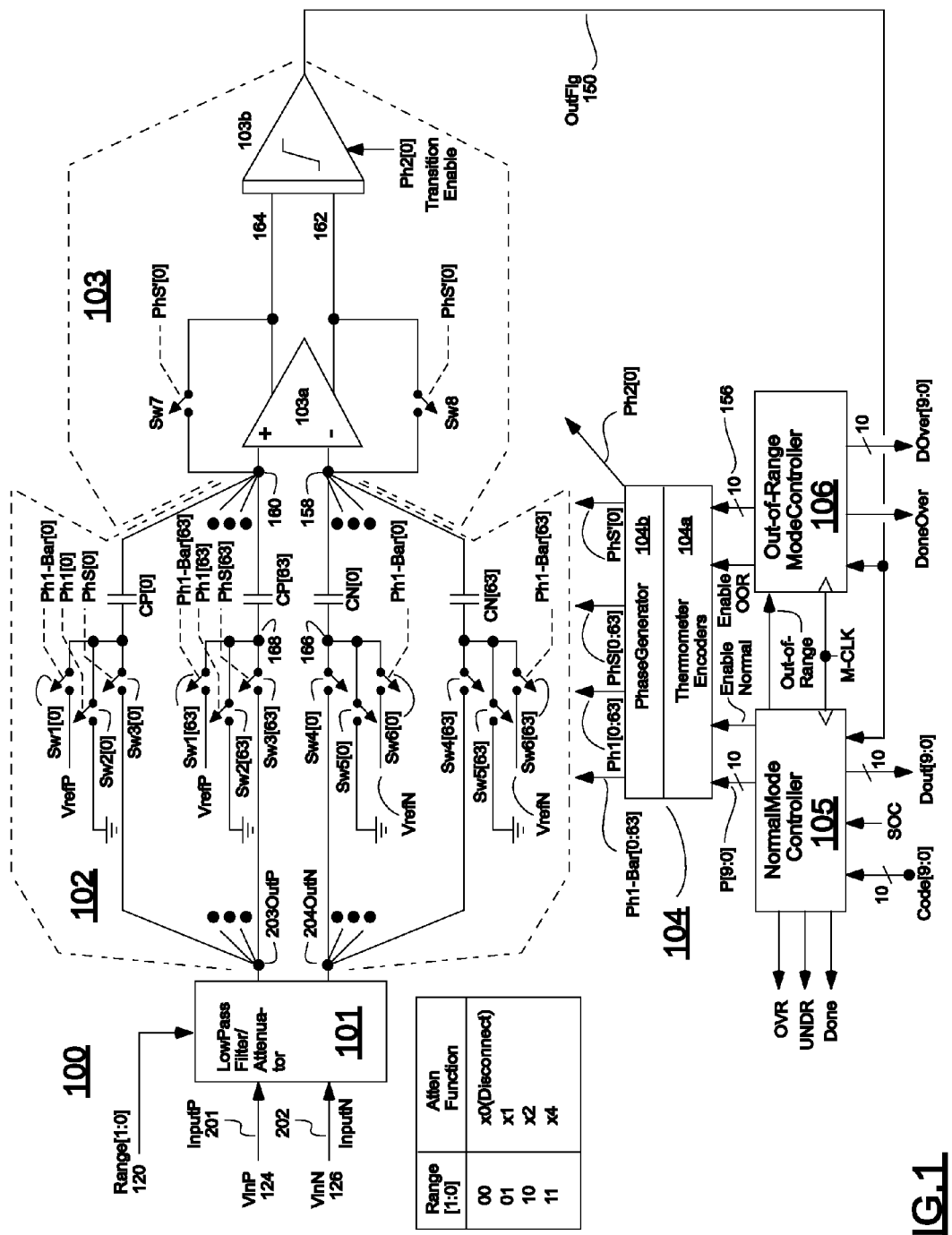
FIG. 1 is a schematic of a first SAR based analog-to-digital converter in accordance with the present invention.

An embodiment of the present invention is termed a Data Acquisition System ("DAS"). Referring to FIG. 1, in one such DAS 100, a dual mode converter architecture is provided, including a low pass filter and prescaler ("LPF") 101, a combination thermometer encoder 104a and phase generator 104b (collectively designated as 104), a comparator 103, a sample and hold circuit ("SH") 102, a normal mode controller ("NMC") 105, and an out of range controller ("ORC") 106. Various control and data signals are shown. In some embodiments the input voltage $V_{in}$ is presented to the low pass filter 101 as differential signals, $V_{inP}$ (on line 124) and $V_{inN}$ (on line 126). In some embodiments the voltage input ($V_{in}$) is not differential. Vin is filtered and scaled by the LPF 101. Scaling magnitude is specified by a supplied RANGE signal 120, which in the illustrated example is two bits wide ([1:0]). In one embodiment, as is indicated by the legend, the scaling ranges are specified as times-1 (×1) by a 01 code, times-2 (×2) by a 10 code, times-4 (×4) by a 11 code; and a disconnect (×0) is specified by a 00 code. The corresponding LPF output signals, $OUTPUT_P$ and $OUTPUT_N$, are provided on respective lines, 203 and 204 to the sample-and-hold (SH) unit 102.

The sample-and-hold circuitry 102 operates as a switched-capacitor digital-to-analog converter (sc-DAC) and includes a plurality of capacitors across which respective voltages are developed by actuation of the schematically illustrated switch armatures. Although only four exemplary capacitors are shown for schematic simplicity, in one embodiment there are actually a large number (128) of such capacitors in the switched-capacitor DAC, the number and capacitance distribution being sufficiently large to provide 1024 discrete output levels (a 10-bit DAC). In one embodiment, the 1024 discrete output levels are mapped across a 32-by-32 grid such that two 5-bit designations define a specific level amongst the 1024 discrete output levels. Unit 104 contains two 5-bit encoders (two thermometer bar style encoders that each convert a respective 5 bit input into a respective coarse and fine 32 level bar code). The generated codes define capacitive voltage dividers with a desired number of capacitors on the Vref side or ground side of each summing node (160 or 158) so as to produce a desired one of the 1024 discrete output levels for comparison against the input analog voltage, Vin. As seen, the sc-DAC 102 has two summing nodes, 160 and 158. A first of these summing nodes, 160, connects to a noninverting input of a differential front-end preamplifier 103a in comparator portion 103 and a second of these nodes, 158, connects to an inverting input of the preamplifier 103a. The positive output line (164) of the differential preamplifier connects to the noninverting input of an analog-to-digital comparator 103b and the negative output line (162) of the preamplifier connects to the comparator's inverting input.

Design of switched-capacitor DACs is well known to those skilled in the art so discussion here will present mostly functional concepts. Each of the illustrated capacitors: CP[0], CP[63], CN[0] and CN[63] has a right side plate that connects to a respective one of positive and negative summing nodes 160 and 158. Each of the exemplary capacitors in the series CP[0] through CP[63], and CN[0] through CN[63] further has a left side plate that connects to a respective triad of front-end switching elements as shown in area 102 of FIG. 1. Each triad allows the left side plate to connect momentarily to a reference voltage source (VrefP or VrefN), or to ground, or to the attenuator-output sample voltage (OutP 203 or OutN 204). The timings of the openings and closings of each switching element is controlled by a variable clock signal indicated next to the switch. Thus, the top most switch, Sw1[0] is controlled by a Ph1-Bar[0] clock signal, the next lower switch, Sw2[0] is controlled by the Ph1[0] (phase 1) clock signal, the third switch, Sw3[0] is controlled by the PhS[0] (sample acquire) phase signal, the next of the switches (Sw1[1]—not shown) is controlled by a Ph1-Bar[1] clock signal, and so on. Switches Sw4[0] through Sw6[63] are similarly controlled for the negative differential side of the comparison circuit.

Phase generator 104b outputs the respective Ph1[0:63], Ph1-Bar[0:63} and PhS[0:63] switch element phasing signals. It may be tempting to thoroughly study the details of the sc-DAC design. However that could lead to missing the primary objective of the overall design, namely, that the combination of blocks 102, 103 and 104 compares the analog input sample, $V_{in}$; as supplied at nodes 203 and 204, against an analog guess sample which is essentially generated by the thermometer encoder 104a and the phase generator 104b. Moreover, units 103a and 103b operate to produce a binary decision signal, OutFlg 150 that indicates whether the guess is greater than, or less than (and equal to, for one of these binary results) the attenuated sample value. Switches Sw7 and Sw8 are temporarily closed by the PhS'[0] phase signal to temporarily null nodes 160 and 158. The Ph2[0] phase signal is activated to allow an output transition by comparator 103b when valid comparison voltages are present on lines 164 and 162. Ph2[0] is kept deactivated when invalid transients may be present on lines 164 and 162, this preventing the output 150 of comparator 103b from generating a false transition.

The thermometer encoder/phase generator 104 converts a current guess value (i.e. P[9:0]) from a binary code representation to a thermometer code representation, and then finally into a capacitive voltage divider representation. When thermometer code representation is used, one part of the thermometer code word (e.g., a 64 bit word) is all zeroes and the remaining part is all ones. The number of ones represents the digital value of the input and there is only one boundary between ones and zeroes in the converted value. A simple example of thermometer encoding is shown in the example table immediately below.

Thermometer Code Example

| Decimal | Binary | Thermometer code |
|---------|--------|------------------|
| 0 | 000 | 0000 |
| 1 | 001 | 0001 |
| 2 | 010 | 0011 |
| 3 | 011 | 0111 |
| 4 | 100 | 1111 |

In one embodiment, the thermometer encoder/phase generator 104 comprises two 5-bit encoders which convert a 10-bit binary input (e.g., P[9:0]) into respective coarse and fine thermometer encoded words, with each such 5-bit encoder outputting a respective 32 bit wide, thermometer code word. One of the 32 bit wide, thermometer code words represents the less significant bits 0 to 4 of the input guess value (e.g., P[9:0]) and the other 32 bit wide, thermometer code word represents the more significant bits 5 to 9 of the input guess value (e.g., P[9:0]). Design of thermal encoders is well known to those skilled in the art of DAC design so further details of the 5-bit thermometer encoders is not presented here.

Each of the three, 64-bit phase signals: PhS[63:0], Ph1[63:0], and Ph1B[63:0] generated by the thermometer encoder/phase generator unit 104 is derived from the system main clock, MCLK, with small timing differences being provided for each in rising and falling edges as compared to MCLK. Ph2[0] and PhS'[0] are also derived from MCLK. Some phase buses have inverted polarity compared to MCLK. The purpose of the phase buses is to control timing of internal switching functions in sc-DAC 102 and analog-to-digital comparator 103 so as to provide the desired detection of a matched condition between the attenuated input sample Vin (203-204) and the adjustable guess value (P[9:0]), as is further discussed below. Phase generator circuits and the control of timing relationships between phased signals are well known to those skilled in the art of switched-capacitor DAC design and will not be described further here.

Designs of switched-capacitor DAC's similar to 102 are also known to those skilled in the art. What is unique about sc-DAC 102 is that Y-shaped voltage balancing networks are programmably formed with different amounts of capacitive coupling being programmably defined between the central summing node of the Y-shape (node 160 or 158) and the three corresponding voltage end points of the Y-shaped network (namely, ground, OutP or OutN, and VrefP or VrefN) as the number of capacitors participating in each leg of the Y-shaped network changes in response to the switching control signals, Ph1, Ph1-Bar and PhS. Section 102 may be implemented by DAC designs other than a switched-capacitor DAC design. Advantages of sc-DAC designs are that they tend to consume lesser amounts of power and they can be accurately implemented in monolithic integrated circuits (IC's) despite process or temperature variations because capacitor geometries can be controlled to high levels of similarity on a given one of mass produced IC's. In one embodiment, there are two categories of identical capacitors. There are 32 coarse adjusting capacitors and 32 fine adjusting capacitors for each of the Positive and Negative summing nodes, 160 and 158. The fine adjusting capacitors are switched by the 32 least significant thermometer code bits and adjust the Y-network leg capacitance by a factor of 1/32 compared to the contributions of the coarse adjusting capacitors which are switched by the 32 most significant thermometer bits, thereby enabling the use of two 5-bit thermometer encoders to provide 32×32=1024 discrete guess values.

The comparison of the current conversion guess value (e.g., P[9:0]) as represented in thermometer code to the filtered analog input voltage on lines OUTPUTP 203 and OUTPUTN 204 begins with the output of comparator 103*b* being disabled from transitioning by de-asserting the PH2[0] transition enable signal. At about the same time, clock signal PhS'[0], a slightly phase-shifted version of the PhS sampling signal, temporarily closes switches Sw7 and Sw8 in the feedback loops of the comparator's preamplifier 103*a*. Closing switches Sw7 and Sw8 forces the preamplifier to null its output offset and also provides a ground reference for the right side plates of capacitors CP[63:0] and CN[63:0] at their respective summing nodes, 160 and 158. At about the same time that Sw7 and Sw8 close, programmably enabled ones of switches Sw3[63:0] connect OutputP 203 to the left side plates of respective capacitors CP[63:0]. Similarly, selected ones of switches Sw4[63:0] are closed and the voltage on line OutputN 204 is applied to respective ones of capacitors CN[63:0]. The PhS[63:0] signal keeps the selected sampling switches closed long enough to charge their respective capacitors to the OutP or OutN level, then switches Sw7, Sw8, Sw3[63:0], and Sw4[0:64] are opened, thereby changing the capacitors from sample mode to hold mode. (Although the illustrated example shows the sample and hold as being integrated into the sc-DAC capacitor networks, it is within the scope of the disclosure to use other sample and hold techniques or none as may be appropriate for given applications.)

Next, selected ones of switches Sw1[63:0], Sw2[63:0], Sw5[63:0], and Sw6[63:0] are closed or opened according to the value of the corresponding bits in the thermometer code, per the following Switch States table.

DAC 102 Switch States

| Switch | Thermometer code Bit n = 0 | Thermometer code Bit n = 1 |
|--------|----------------------------|----------------------------|
| Sw1[n] | open | Connected to VREFP |
| Sw2[n] | Connected to Gnd | open |
| Sw5[n] | Connected to Gnd | open |
| Sw6[n] | open | Connected to VREFN |

After switches Sw1[63:0] and Sw2[63:0] are so set, the voltages on the connected left side P plates 168 (×64) are pulled up or down to the scaled voltage corresponding to the value of the related thermometer code bit. Since S7, S8, Sw3[63:0], and Sw4[63:0] are all open at this time, capacitors CP[63:0] and CN[63:0] are connected as high pass filters with the input impedance of the preamplifier stage 103*a* of comparator 103. The voltage steps generated by setting switches Sw1[63:0] and Sw2[63:0] pass through capacitors CP[63:0] and sum at the common connection point 160 of these capacitors. The amplitude of the resulting output step on node 160 is the difference between the analog input voltage to DAC 103 and the scaled voltage corresponding to the current value of thermometer code. A voltage step on summing node 158 is formed in a similar manner by the operation of switches Sw5[63:0], Sw6[63:0], and capacitors CN[63:0]. The voltage steps on nodes 158 and 160 gradually decay through the input resistance of the preamplifier 103*a*, so preamplifier input resistance and the values of capacitors CP[63:0] and CN[63:0] are chosen to keep the voltage drop to less than ½ LSB equivalent during the time required to make a single comparison between the current ADC conversion value and the analog input voltage. The voltage steps on nodes 158 and 160 are amplified by the preamplifier 103a and output on lines 162 and 164. When the voltage on line 164 is greater than the voltage on line 162, and the transition enable signal Ph2[0] is asserted, the result flag, OUTFLG 150 from comparator 103b is driven high, otherwise OUTFLG 150 is driven low.

It follows from this that the comparator output signal, OUTFLG (150) remains in one state as long as the current ADC conversion value remains either less than or greater than the analog input voltage. After the current ADC conversion value crosses over the threshold representing the attenuated analog input value (203-204), the comparator output OUTFLG 150 changes state. The following simplified example illustrates how the comparator output changes state.

EXAMPLE

Iteration 0: Beginning guess value of current conversion is less than the actual analog input voltage.
  Starting conditions (attenuation factor=×1):
  VinP 124=OutputP 203=3.6V
  VinN 126=OutputN 204=0V
  Current conversion guess value (represented by P[9:0]) =3.3V
Iteration 1:
  Voltage on summing node 160=(3.3−3.6)=−0.3V
  Voltage on summing node 158=0V
  Voltage on line 164<voltage on line 162
  When Ph2[0] asserted, OUTFLG 150 is driven low
Iteration 2:
  The NMC 105 increments current conversion guess value to 3.5V
  Voltage on node 160=(3.5−3.6)=−0.1V
  Voltage on node 158=0V
  Voltage on line 164<voltage on line 162
  When Ph2[0] asserted, OUTFLG 150 remains low
Iteration 3:
  The NMC 105 increments current conversion guess value to 3.7V
  Voltage on node 160=(3.7−3.6)=0.1V
  Voltage on node 158=0V
  Voltage on line 164>voltage on line 162
  When Ph2[0] asserted, OUTFLG 150 is driven high.

The NMC 105 adjusts its guess in accordance with a convergence algorithm such as one detailed below where the algorithm stops if the OUTFLG 150 has not switched state within a predefined number of steps less than the number of resolution bits of the ADC output. The switch of state indicates to the NMC 105 that the current guess value (represented by P[9:0]) has crossed through the input sample value (Vin). In one embodiment, comparator 103b includes a level shifter that outputs the digital signal, OUTFLG 150 indicative of whether Vin is greater than the analog guessed voltage that corresponds to digital signal P(9:0) or not.

The NMC 105 and ORC 106 are connected to corresponding input ports of the thermometer encoder/phase generator 104. Encoder/generator 104 uses a thermal encoding algorithm as indicated above wherein all relevant bits from the LSB and up of each of coarse and fine values are set high to digitally represent values of increasing magnitude. Other techniques may of course be used. In essence, the thermal encoder and phase generator 104 operates in conjunction with the sample-hold circuit 102 as a difference-indicating DAC that converts a supplied 10-bit digital signal, i.e., P[9:0] into a counterpart analog voltage that presents itself as part of the analog difference signal produced across the capacitors of the SH circuitry 102. In other words, its analog counterpart output (not directly shown, see instead the block diagram of FIG. 3) is a voltage representative of the digital input word, P[9:0] presented to it by one of NMR 105 and ORC 106, as selected by corresponding normal mode or OOR mode ENABLE signals. This analog counterpart output may be considered as being provided across the summing nodes 160 and 158 of the preamplifier 103a. The corresponding and level shifted, comparator binary output (150) is fed back to the NMC 105 and ORC 106 to indicate the state of the comparison (i.e., whether the zero difference point has been crossed or not).

In one embodiment, the REG unit (not shown) provides the NMC 105 with a starting value for each next voltage conversion operation, providing the initial guess value on start-value receiving lines CODE[9:0]. The REG unit then asserts the Start of Conversion (SOC) line. If upon trying to converge the guess value P[9:0] with the actual sample value Vin (as represented across nodes 203-204), the NMC determines that Vin is within a certain predefined vicinity of the starting value CODE[9:0], the NMC completes a low-power "normal" analog to digital conversion and returns a ten-bit result signal to the REG on lines DOUT[9:0]. As indicated, the low power version is termed a "normal conversion." If the NMC determines that Vin is outside of that certain vicinity of the supplied start-value CODE[9:0] then the NMC asserts an out-of-range signal, OOR to the ORC 106. In response the ORC 106 performs a complete ten-bit conventional SAR conversion that, in the illustrated 10-bit ADC example requires a sequence of 10 comparisons. The result of the conventional SAR conversion from the ORC is provided to the REG on lines DOVER[9:0], with the validity of the result being signaled by the DoneOver line. This is termed an "out of range conversion."

The illustrated DAS 100 starts with an attempt of a normal conversion operation where twelve clock periods are used for LPF 101 and SH 102 to settle, and up to fourteen clock periods are used to resolve a +/−9 1LSB correction increment range centered at an initial start value of the ten bit predictive CODE[9:0] as provided by the REG. The normal mode result is returned to the REG unit on the normal output lines, DOUT [9:0]. In some embodiments the OOR flag is triggered if the input is beyond +/−9 1LSB correction incrementing range of the predictive CODE[9:0]. In this case, the over-range mode will take an additional sixteen clock periods for a full conventional SAR conversion, providing the result to the REG unit on the out-of-range output lines, DOVER[9:0]. In some embodiments, the REG unit requests DAS conversions at regular intervals wherein the intervals are spaced so closely to one another so as to not allow enough time for an out of range conversion between the intervals. When an out of range conversion is required in such a closely-spaced conversions embodiment, another identical ADC is activated to convert the next channel input, thus maintaining throughput. That is, data continues to be taken at regular intervals, but the digital conversion results for some samples may be available at irregular intervals. In some embodiments additional power saving is achieved by using a pipelined architecture.

Figure 2:
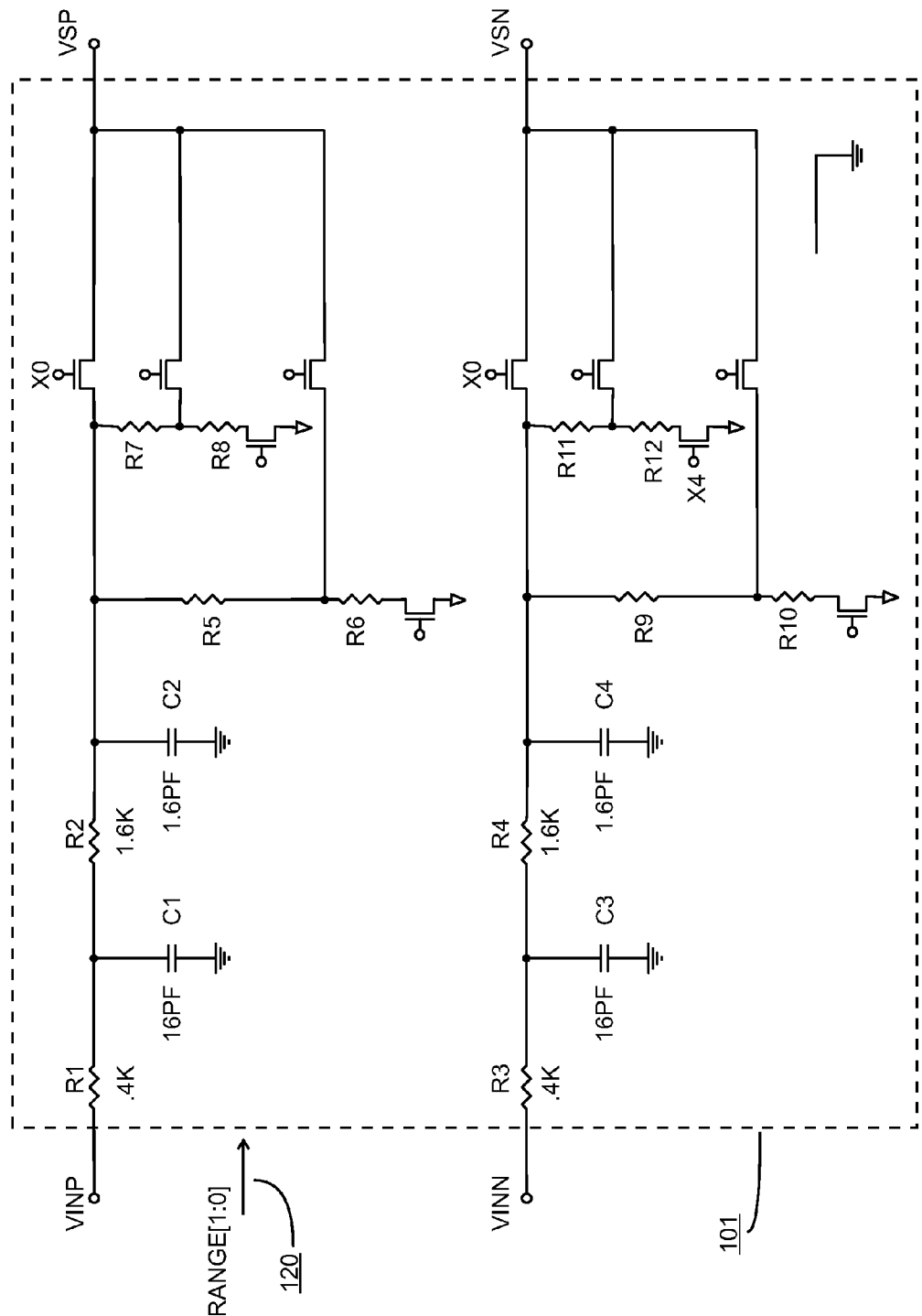
FIG. 2 is a schematic of a low pass filter with input range selection capabilities.

Referring to FIG. 2, an embodiment of the LPF is shown to include a second order low pass filter for providing noise filtering. The cascaded passive RC filter has a structure of R1,R3=400 Ohm, C1,C3=16 pF, R2,R4=1600 Ohm, and C2,C4=4 pF typically. An input range select has a 12K to 4K resistive divider for 5.5V maximum input (selected by signal X4) and a 5K to 5K resistive divider for 2.75V maximum input (selected by signal X2). No resistive divider is used for 1.375V maximum input in unity divider mode, selected by signal X0. The input to the SH circuit forms part of the filter.

In one embodiment the sampling switch on-resistance is lumped into the LPF model as 200 Ohms and the sampling capacitor is 1.4 pF to ground. Filter values are computed to provide an appropriate settling time for the application. One skilled in the art will understand how to calculate component values to match the filter characteristics to the ADC resolution and conversion time as may be appropriate. In some embodiments the signals are fully differential for better CMRR (common mode rejection ratio) and PSRR (power supply rejection ratio).

As indicated above, the supervising REG (not shown) provides an estimated value for Vin to the NMC on lines CODE [9:0]. In one embodiment, wherein analog input voltage changes are small between conversion requests, the REG estimates the next estimation value, $V_{est}(n+1)$ to be equal to the previous result value V(n). That is, $V_{est}(n+1)=V(n)$. In another embodiment, the value $V_{est}(n+1)$ is estimated by the REG by using a first order slope model which determines slope over the sampling period from the previous two result values V(n) and V(n−1), or as expressed in equation Eq. 1:

$$V_{N+1}=V_N+\Delta V_N=V_N+(V_N-V_{N-1})=2*V_N-V_{N-1} \qquad \text{Eq. 1}$$

In another embodiment based on transient correction, the starting value is estimated per the following reactance equation Eq. 2:

$$V_{N+1}=V_N+dV_N+L*dI*T \qquad \text{Eq. 2}$$

where L is a preestablished value representing system inductance, dI is a changing current such as the output ripple current (change in total output current as a result of switching induced ripple) and T is the sampling period for sampling $V_N$.

Figure 3:
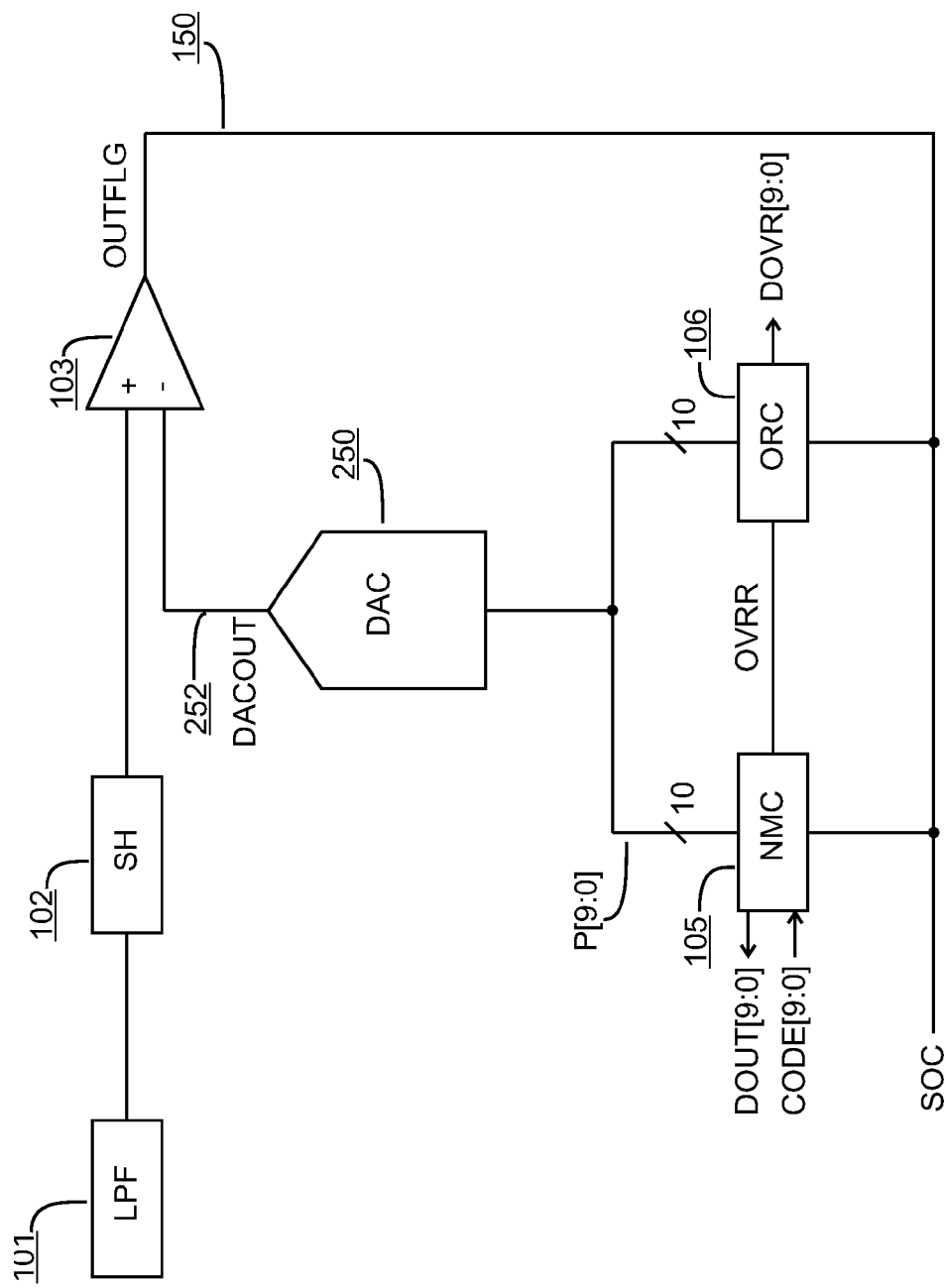
FIG. 3 is a block diagram of an SAR based ADC in accordance with the present invention.

Referring to the block diagram of FIG. 3, this is provided for easier understanding of the illustrated method of the present invention. The supervising REG (not shown) provides an estimate of the next conversion to NMC on CODE [9:0] and starts the conversion process by asserting a start-of-conversion signal, SOC. The NMC 105' provides the value P[9:0] to DAC 250, wherein P[9:0] is the value within NMC for the instant iteration of the illustrated method of the invention. CODE[9:0] does not change during the conversion, but the temporarily stored value of P[9:0] changes, responsive to the results of the DAC conversion of P[9:0] to a voltage, and further in response to the comparison result produced when the analog DAC output, DACOUT is compared to the SH output by comparator 103'. As seen, the DAC output 252 is connected with the inverting terminal of comparator 103' for comparison to Vin, the output of SH 103'. Comparator 103' produces the OUTFLG signal 150, which is connected to the NMC 105' and to the ORC 106'. The OUTFLG signal 150 is a logical high if Vin is higher than DACOUT, otherwise OUTFLG is a logical low.

In one embodiment, the NMC 105' performs a sequenced search for the final conversion value based on a sequence of OUTFLG values 150 received from comparator 103'. One search strategy used by the NMC (as is detailed in the below lookup Table 2) is based upon the assumption that DOUT[9:0] will be equal to or close to CODE[9:0]. To reach closure as quickly as possible the search begins at CODE[9:0] and expands away from that value towards the result until conversion is attained or until the NMC determines that the result varies by more than desired a predefined, tolerable amount (in one embodiment, +/−9 1LSB increments) from the value of CODE[9:0].

TABLE 2

| FS STEP # | | | | | | CORR STEP # | | | | | | Final |
|---|---|---|---|---|---|---|---|---|---|---|---|---|
| 1 | 2 | 3 | 4 | 5 | 6 | 1 | 2 | 3 | 4 | 5 | 6 | Result |
| L | L | L | L | L |   | 2 | 4 | 2 | 1 | S |   | Over |
| L | L | L | L | H |   | 2 | 4 | 2 | 1 | S |   | 9 |
| L | L | L | H | L |   | 2 | 4 | 2 | −1 | S |   | 8 |
| L | L | L | H | H |   | 2 | 4 | 2 | −1 | S |   | 7 |
| L | L | H | L | L |   | 2 | 4 | −2 | 1 | S |   | 6 |
| L | L | H | L | H |   | 2 | 4 | −2 | 1 | S |   | 5 |
| L | L | H | H | L |   | 2 | 4 | −2 | −1 | S |   | 4 |
| L | L | H | H | H |   | 2 | 4 | −2 | −1 | S |   | 3 |
| L | H | L |   |   |   | 2 | −1 | S |   |   |   | 2 |
| L | H | H |   |   |   | 2 | −1 | S |   |   |   | 1 |
| H | L |   |   |   |   | −1 | S |   |   |   |   | 0 |
| H | H | L | L |   |   | −1 | −2 | 1 | S |   |   | −1 |
| H | H | L | H |   |   | −1 | −2 | 1 | S |   |   | −2 |
| H | H | H | L | L | L | −1 | −2 | −4 | 2 | 1 | S | −3 |
| H | H | H | L | L | H | −1 | −2 | −4 | 2 | 1 | S | −4 |
| H | H | H | L | H | L | −1 | −2 | −4 | 2 | −1 | S | −5 |
| H | H | H | L | H | H | −1 | −2 | −4 | 2 | −1 | S | −6 |
| H | H | H | H | L | L | −1 | −2 | −4 | −2 | 1 | S | −7 |
| H | H | H | H | L | H | −1 | −2 | −4 | −2 | 1 | S | −8 |
| H | H | H | H | H | L | −1 | −2 | −4 | −2 | −1 | S | −9 |
| H | H | H | H | H | H | −1 | −2 | −4 | −2 | −1 | S | Under |

Legend for lookup Table 2:
H = {Vin ≤ P[9:0]}
L = {Vin > P[9:0]}
S = Stop

Referring to Table 2, a normal search pattern as may be executed sequentially in the NMC 105 is shown. Table 2 may be read, left to right across each row, as representing a sequence of steps carried out by the NMC, wherein the received OUTFLG flag sequence (found under the flagged sequence column, FS) determines the corresponding amount of correction the NMC adds or subtracts to its previous P[9:0] value in response to each respective H or L value the NMC historically receives on the OUTFLG line 150. The respective corrective action may be found under the CORR column on the same row as the matching FS sequence and for the respective, sequential Step number. At each step the instant value of P[9:0], as converted to a voltage by DAC 250, is compared with Vin, then an adjustment is made to P[9:0] per Table 2, and P[9:0] is reevaluated until either a match is found or too many attempts have been made without success, signifying that Vin is outside of the desired vicinity of the voltage that CODE[9:0] represents. In that event the conversion process begins again with the assertion by NMC of the signal OOR to the ORC 106. In response, the ORC now performs a conventional SAR conversion by presenting its search values to DAC 250 in response to OUTFLG until a full ten-bit conversion is completed. This longer, full ten bit conversion procedure is standard in the industry and is not presented in detail here.

Examination of Table 2 will show that in Flagged Sequence step FS #1, the convergence algorithm determines whether the initial guess is above or below the true answer. If below, the convergence algorithm steps up in next step FS #2. If above, the convergence algorithm steps down in next step FS #2. The convergence algorithm continues stepping in a direction towards the true answer until either the limited number of allowed steps (e.g., 5) is exceeded or the algorithm steps through the true answer, in which case the OUTFLG line 150 toggles. The size of the stepping can change as the algorithm waits for the first toggling of the OUTFLG line 150. In one embodiment, the step size becomes progressively more aggressive at first (i.e., −1, −2, −4 in the case of the rows whose final answer is −3 through −9 and Under) as the algorithm seeks to find a guess value that will have taken it past the true answer. Then when the first toggling of the OUTFLG line 150 occurs, the convergence algorithm steps in the reverse direction, but by a step size less than the one that just took it past (across) the true answer. This is so because the convergence algorithm now knows that the true answer is bounded within the step size that caused the first toggling of the OUTFLG line 150. If the OUTFLG line 150 toggles again on the first reversal, the convergence algorithm can conclude that the true answer is further bounded within the step size of that first reversal and now the algorithm makes a second reversal of a yet smaller step size. If the OUTFLG line 150 does not toggle again on the first reversal, the convergence algorithm can conclude that the true answer is bounded between the start of the step size that caused the first toggling of OUTFLG and the end of the current, first reversal step, where the current, first reversal step did not produce yet another toggling of OUTFLG. Thus the convergence algorithm can define bounded regions of decreasing size after the OUTFLG line 150 toggles the first time. Although the convergence algorithm shown in Table 2 uses step sizes that are polarized integer powers of two (−4, −2, −1, +1, +2, +4), other values could be used if desired. In some special cases, toggling of the OUTFLG is not used for determining further bounds, rather it may be that the OUTFLG toggles as a result of the last allowable correction. For example, referring to the case in Table 2 with a Final Result of +9, the OUTFLG toggles as a result of the fourth adjustment trial. Because the last correction step size is one, the answer is known even though OUTFLG toggled only once. As can be seen from examination of Table 2, the algorithm stops and the answer is known any time OUTFLG toggles in response to a correction of one LSB. In another embodiment the step size may be set to always be +1LSB or −1LSB, and the algorithm will then continue to iterate until OUTFLG toggles, at which point the algorithm stops because the answer is known to have been bounded within the very last +1LSB or −1LSB step.

Figure 4A:
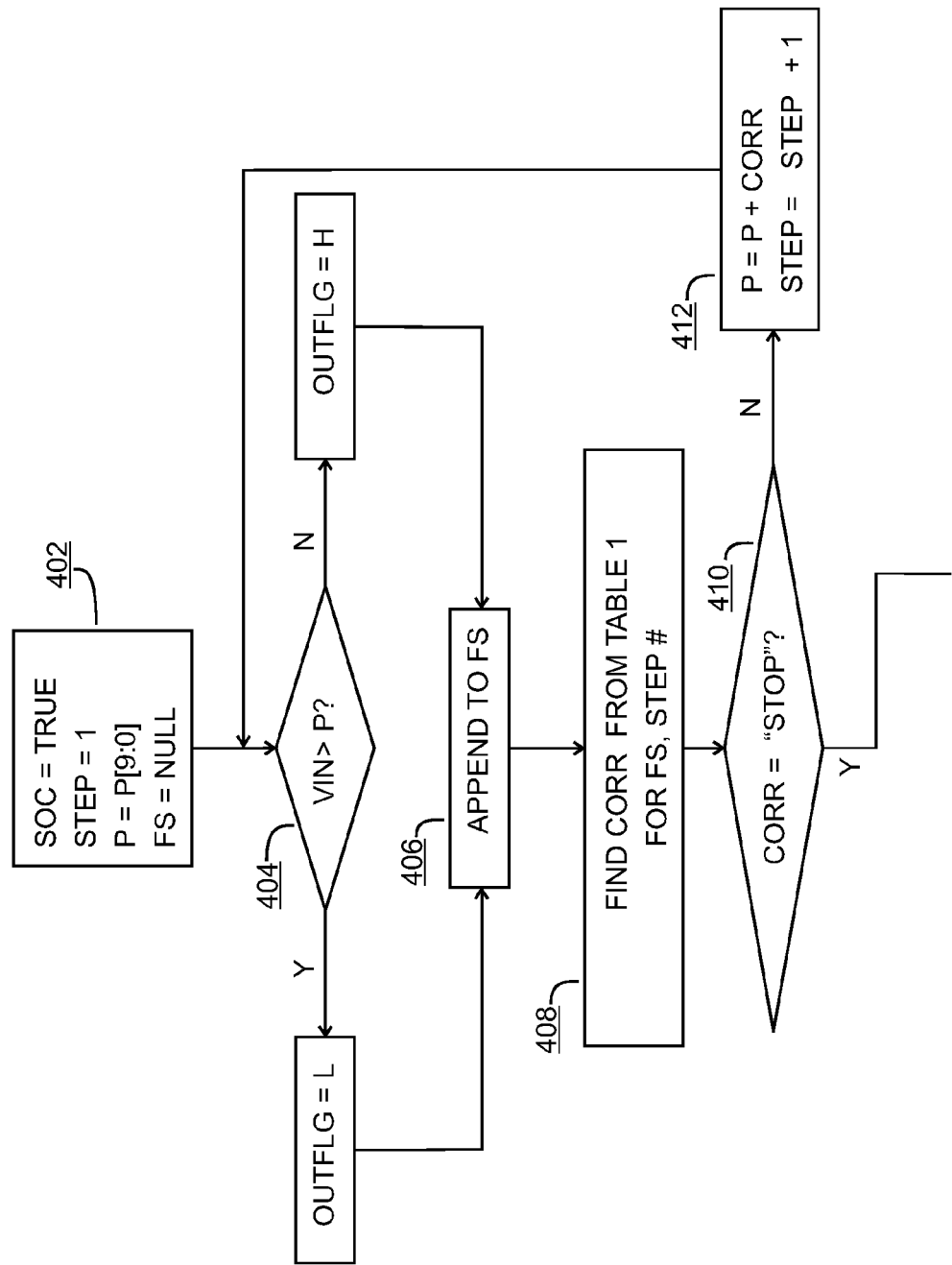
FIGS. 4A and 4B disclose a flow chart of a method of the present invention.
Figure 4B:
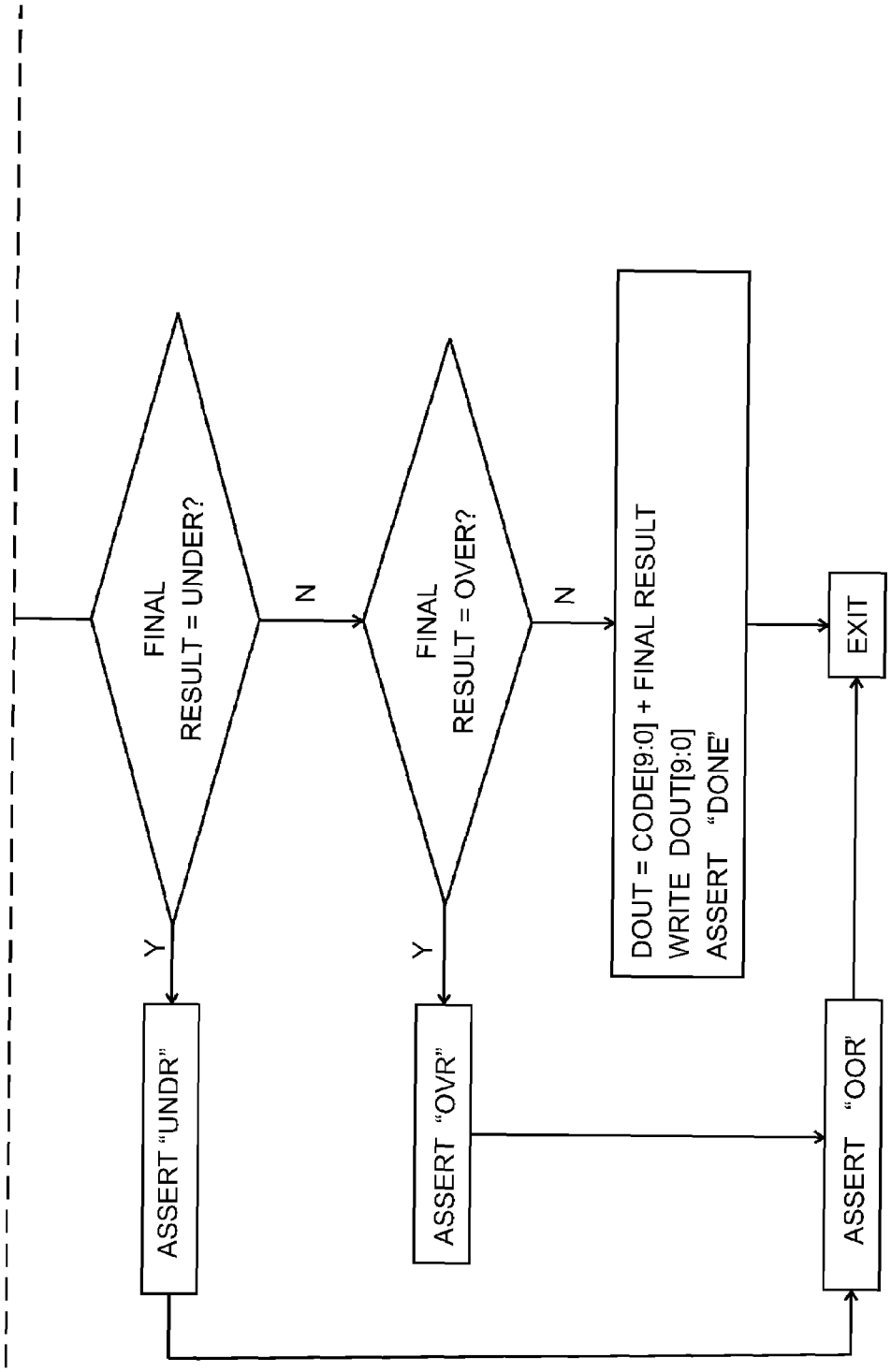

FIGS. 4A-4B provide a flow chart of an NMC sequencing method in accordance with the invention. At step 402 the NMC initializes its Step count to 1 when SOC is asserted. Note that the notation "P" in FIG. 4 is equivalent to the numerical value of the digital word, "P[9:0]". The sequence history string variable, FS is set to 'null.' At step 404, the value of P is compared to Vin. In one embodiment, this comparison happens in the comparator 103. The OUTFLG signal is set to represent a logic high ("H") if No, otherwise it is reset to represent a logic low ("L"). At step 406, the latest OUTFLG signal is appended to the FS string. At step 408, the appended-to FS string is applied as an input to a look-up table in order to obtain the next correction value, CORR. In one embodiment, the correction values set forth under the CORR column of Table 2 are used for each, historically-developing sequence of the FS string. Thus, if the Step 1 FS string is "H", then the correction value is always −1 per Table 2 and if the Step 1 FS string is "L", then the correction value is always +2 per Table 2.

At step 410 the NMC tests the looked-up correction value to see if CORR="Stop", where the Stop value is a predetermined large value that is used to indicate the normal mode sequence should be halted at this stage. If the Stop condition is not TRUE, the NMC adjusts the value of P per the CORR value found in the table look-up (e.g., Table 2). That is, P=P+CORR. The NMC also increments the Step count and returns to testing step 404. When the Stop condition is encountered (step 410) the NMC ends the process by taking the final correction result from the table look-up (e.g., from the rightmost column of Table 2). in response to the FS string that sequentially developed up until the Stop condition was invoked. The NMC then uses this final correction result to calculate the result of the conversion as DOUT[9:0]=CODE[9:0]+Final Result. The NMC then provides this final conversion outcome answer on port DOUT[9:0] and asserts the signal, DONE. If, however, the table look-up defines the Final Result as constituting the Over condition, then the NMC instead asserts the corresponding signals, OVR and OOR and exits the illustrated normal conversion method. If the Final Result is Under then the NMC instead asserts the corresponding signals UNDR and OOR and exits.

Consider an example wherein Vin is exactly the value estimated by REG as signified by the initial start CODE[9:0].

CODE[9:0]=742d=10 1110 0010b

Full scale=1.375 volts.

$LSB_{10}$=1.375/2^10=0.001343 volts per LSB increment

Vin=0.9963v, or 0.9963/0.001343=742*$LSB_{10}$ where $LSB_{10}$ is the voltage value of one LSB increment for a ten-bit conversion taken with the given full scale value for CODE[9:0]=11 1111 1111 binary.

FIG. 5A illustrates the sequence for this scenario, with the result of a FLAG SEQUENCE of "HL" when the Stop condition is invoked. In response to the initial H value of the developing FS string, the interim correction value is −1 and P temporarily drops down to a value of 741 decimal, causing OUTFLG to now return a L value. In Step 2 however, the Stop condition is invoked and the Final Result (from the row with the OUTFLG sequence of HL) is 0. So the NMC conversion result is CODE[9:0]+Final Result, or

742+0=742, and 742*$LSB_{10}$=742*(0.001343)=0.9963v.

In other words, the initial start value given by the REG was on the mark and no correction was needed to such an initial estimate. The NMC reaches this conclusion in just two steps.

Referring to FIG. 5B, a further example is given with the starting condition having the following scenario:

CODE[9:0]=742d

Full Scale=1.375 volts.

$LSB_{10}$=0.001343 volts per bit increment.

Vin=1.0057v, so (1.0057/0.001343)=749*$LSB_{10}$

In response to this starting condition, the NMC sequencer and the comparator generate the FS sequence, LLLHH with the corresponding lookup corrections and then a Stop as is seen in FIG. 5B. The final lookup correction, or Final Result for FS sequence of LLLHH is +7, so:

DOUT=CODE[9:0]+Final Result=742+7=749

749*$LSB_{10}$=1.0057v.

Finally, to illustrate an example wherein Vin is beyond the desired vicinity of CODE[9:0], consider the starting scenario that is illustrated by FIG. 5C:

Full scale=1.375 volts.

$LSB_{10}$=0.001343 volts per bit increment.

Vin=0.9816v, or 0.9816/0.001343=731*$LSB_{10}$

Looking to FIG. 5C, we see a Final Result of "Under", so the starting estimate from the REG was not close enough to Vin to result in a successful conversion in six steps or less. In this case, then, OOR and UNDR are asserted and the ORC is actuated to complete a faster, standard SAR conversion.

Figure 6:
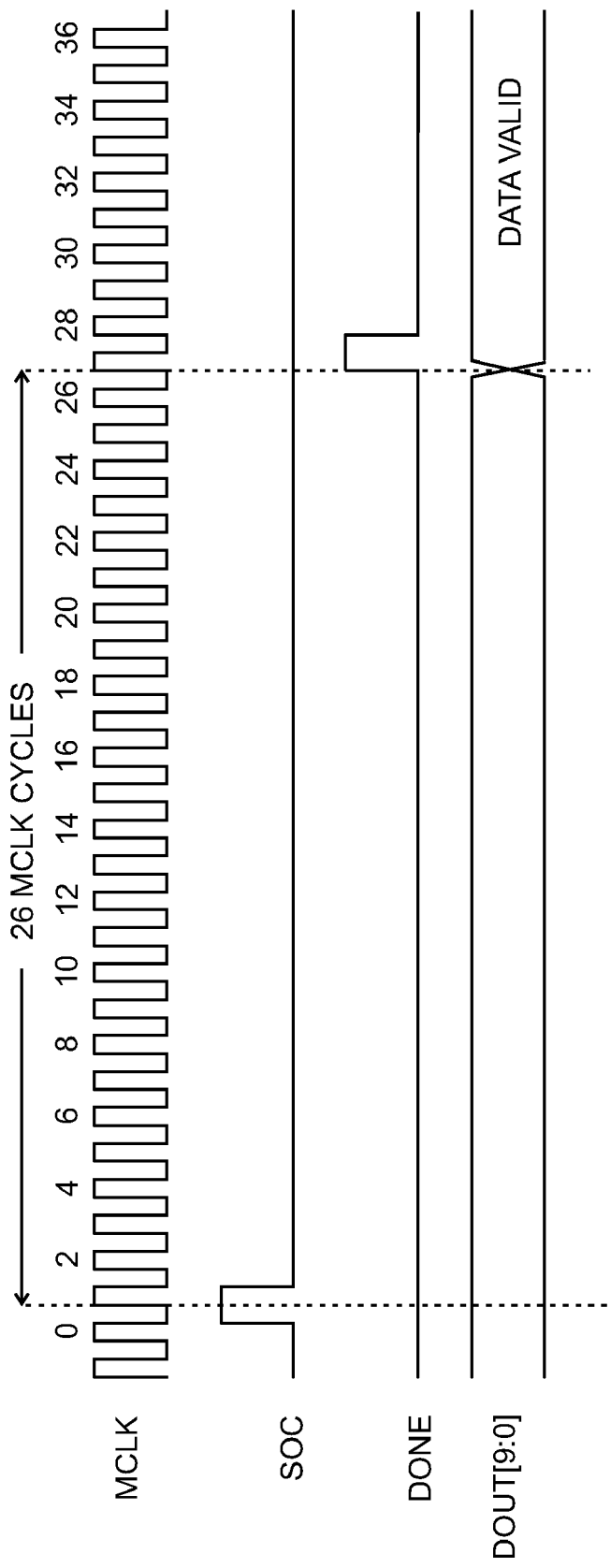
FIG. 6 is a timing diagram for a normal analog to digital conversion performed in accordance with the present invention.

Below Table 3 corresponds to FIG. 6 and illustrates the time that is consumed in one embodiment when the normal conversion is successful.

TABLE 3

MCLK Rising

| Edge No. | Events of DAS channel in normal mode of operation |
|---|---|
| 1 | Input sampling capacitor switched into channel input low pass filter and input attenuator, power up comparator preamplifier. |
| 1-15 | Input low pass filter settling period |
| 15 | Sampling instant of low pass filter output and comparator preamplifier offset. |
| 17 | 1st decision on SAR conversion, ready to receive another "soc" to activate pipelined channel. |
| 19 | 2nd decision on SAR conversion. |
| 21 | 3rd decision on SAR conversion, if necessary. |
| 23 | 4th decision on SAR conversion, if necessary. |
| 25 | 5th decision on SAR conversion, if necessary. |
| 27 | 6th decision on SAR conversion, if necessary. |
| 27 | Data valid in normal mode of operation, "DONE" goes high for one clock cycle. |

The first fourteen MCLK cycles after the assertion of SOC are allocated for settling of the LPF. A maximum of twelve cycles are allocated to a normal conversion, for a total of twenty-six cycles from the assertion of SOC by the REG until the assertion of DONE by the NMC. The period through clock 16 (238 nSec) is the minimum time between conversion requests from the REG that can be accommodated by one SAR if all conversions are normal conversions. If the NMC determines that CODE[9:0] is out of range such that a normal conversion cannot be completed, an additional sixteen cycles are required to complete an out of range conversion. When an out of range condition is present, the ORC produces a conversion value more quickly than could the NMC but consumes more energy in the process of making the conversion. The time for conversion for a complete out of range conversion sequence starting from normal mode is therefore 26+16, or 42 MCLK cycles. In a pipelined embodiment another conversion cycle may begin with assertion of SOC at 33 clocks.

In some embodiments the time between conversion requests from the REG may be less than 33 MLCK clocks without concern for out of range conversions. The DAS 700 shown in FIG. 7 incorporates two identical dual-mode SAR ADCs to reduce the minimum time between requests. The description of inputs, outputs, controls, and operating characteristics for DAS 100 (FIG. 1) are valid for extension to ADC 100A and ADC 100B of FIG. 7. Vin is connected with the low pass filter and attenuator inputs on ADC 100A and ADC 100B. The REG (not shown) provides a starting value for the next voltage conversion on lines CODE[9:0], and selects the sampling instant by asserting line SOC connected with Control Logic/Timing Generator 704. REG asserts POWERDOWN 706 to reduce energy consumption by turning off the DAS when it is not needed. In one embodiment, the Control Logic/Timing Generator 704 saves energy by turning off an ADC (e.g., 100A, 100B) that has completed its conversion, then turning that ADC back on again in time to service the next request from the REG for a new conversion. In another embodiment, the Control Logic/Timing Generator 704 alternates between use of ADC 100A and ADC 100B continuously without interrupting power to maximize conversion throughput.

Figure 7:
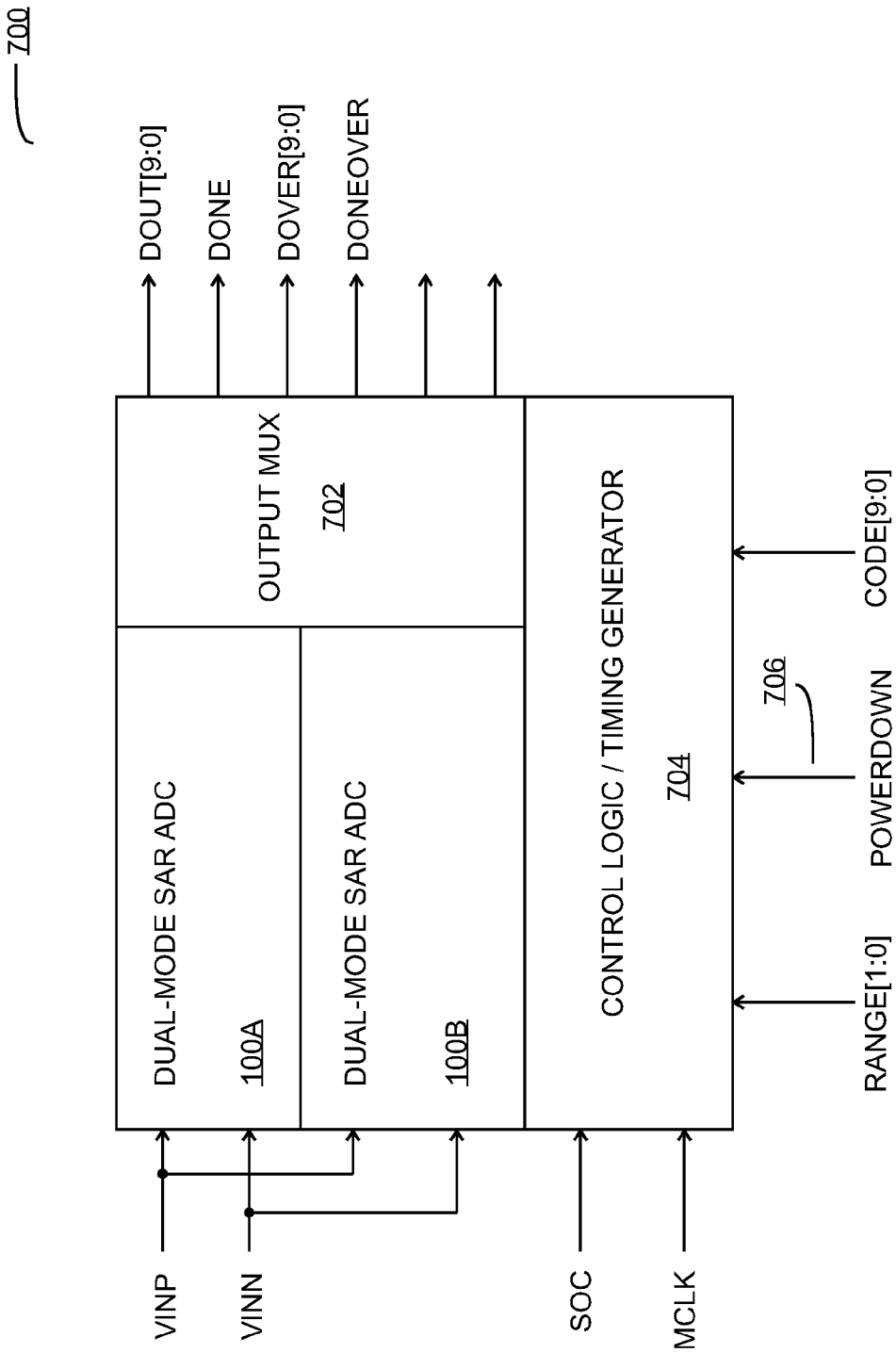
FIG. 7. is a block diagram of a pipelined dual SAR embodiment of the present invention.

The Control Logic/Timing Generator 704 of FIG. 7 distributes the MCLK clock signals to the other blocks in DAS and controls MUX 702 to switch between the output signals produced from ADC 100A and ADC 100B. The Control Logic/Timing Generator 704 alternates between use of the available ADCs so as to begin converting analog input signals to digital output values from one sample command (assertion of SOC) to the next, as requests are received from REG. The sampling interval for two ADCs sequentially converting the same analog input signal at sequential time points is one-half the interval for a single ADC. The longest conversion time is a complete out of range conversion sequence, so the minimum reliable sampling interval for one embodiment with a master clock of 67 MHz is 42 master clock periods divided by 2, or 21 master clock periods or 313 ns.

In another embodiment, the Control Logic/Timing Generator 704 turns off power to an ADC after it completes its conversion while the other ADC continues to perform its conversion. The time to power up an ADC, 12.6 ns, is added to the conversion time to calculate the total conversion latency. For normal conversion, conversion latency is 26 cycles of MCLK plus the power up time of 12.6 ns, or 400 ns total. For a complete out of range sequence beginning from a normal search, conversion latency is 42 cycles of MCLK plus 12.6 ns power up time, or 638 ns total. Since a normal conversion requires only 400 ns compared to 638 ns for an out of range conversion, the Control Logic/Timing Generator 704 turns off the power to the ADC that has just completed a normal conversion for 238 ns, the time difference between normal and out-of-range conversions.

Figure 8:
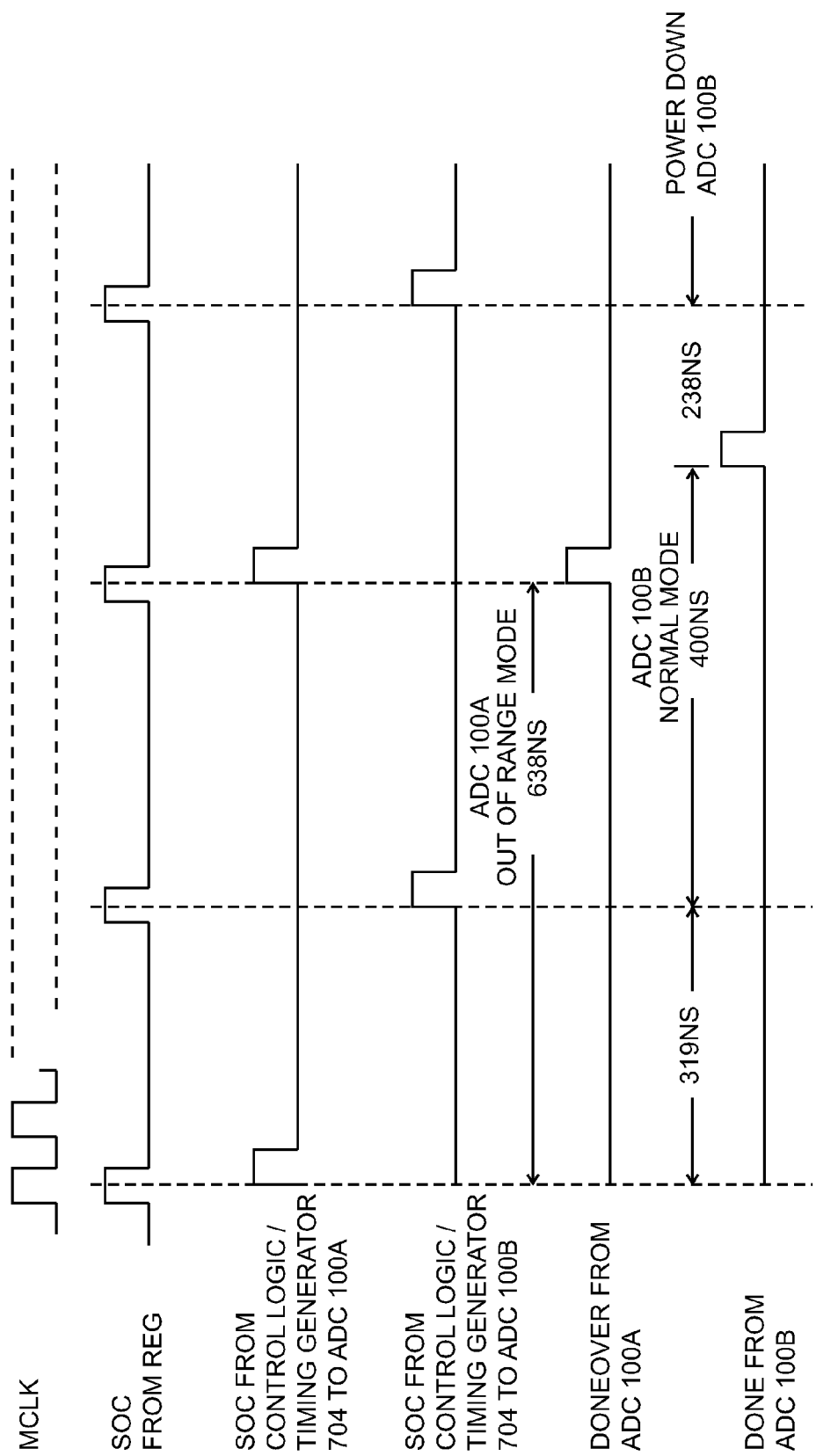
FIG. 8 is a timing diagram of an out of range conversion by one ADC and a normal conversion by another ADC.

FIG. 8 is a timing diagram showing DAS 700 conversion timing for an out of range conversion on ADC 100A followed by a normal conversion on ADC 100B. Time intervals are indicated for MCLK having a frequency of 67 MHz.

Figure 8A:
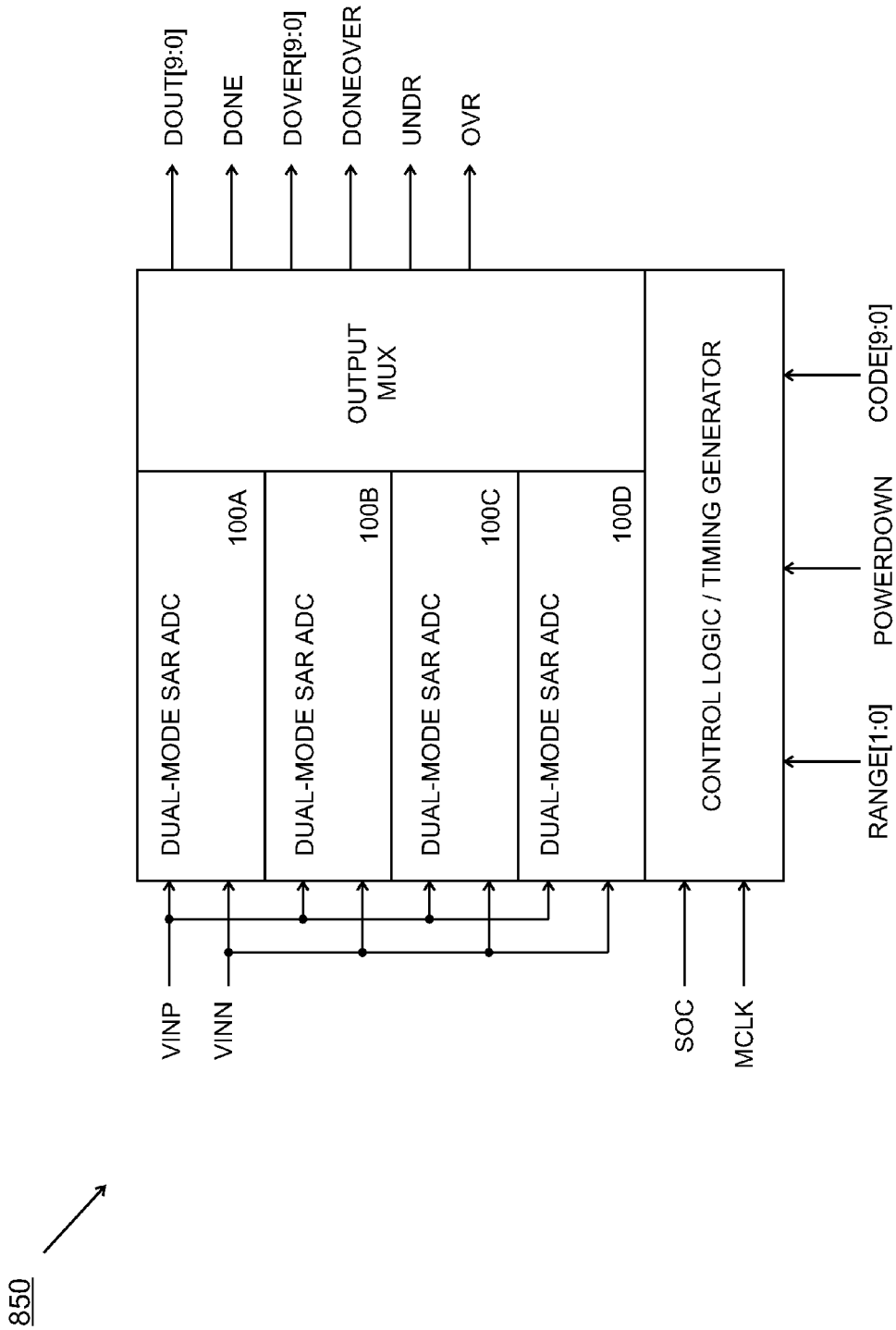
FIG. 8A is an implementation having four copies of the SAR ADC.

Referring to FIG. 8A in another embodiment, two pairs of dual-mode SAR ADCs (100A-100B, 100C-110D) are used to further reduce the minimum time between sample requests from the REG. DAC 850 in FIG. 8A incorporates four identical dual-mode SAR ADCs. The description of inputs, outputs, and operating characteristics for DAS 100 (FIG. 1) are valid here for extension to ADC 100A to ADC 100D. In one embodiment, the Control Logic/Timing Generator 804 turns off the power separately to each of ADC 100A to ADC 100D after each respective ADC completes its conversion. Power is restored to the powered-down ADC in time to service the next conversion request from REG. In one embodiment the Control Logic/Timing Generator of FIG. 8A uses the following algorithm to select the next ADC to be used in converting a sequence of incoming analog values denoted as sample points 1-4:

ADC 100A converts Point 1
ADC 100C converts Point 2
IF (ADC 100A performs an out of range Conversion)
   THEN
     (ADC 100B converts Point 3)
   ELSE
     (ADC 100A converts Point 3)
IF (ADC 100C performs an out of range Conversion)
   THEN
     (ADC 100D converts Point 4)
   ELSE
     (ADC 100C converts Point 4)

The algorithm repeats with subsequent Point 5 going to ADC 100A.

In some embodiments the blocks shown as "ADC100x" in FIG. 8A each incorporate a NMC and an ORC which share a common SH. Conversion requests are sent to each block in sequential, round robin order, i.e., ADC100A, ADC100B, ADC 100C, ADC 100D, then back to ADC 100A. Conversion timing is such that any one block will complete a worst-case out of range conversion prior to completion of conversion by the next block, thus preserving the data throughput rate and one-to-one relationship between the input sampling sequence and the result output sequence.

In some embodiments clipping around VIN being close to zero volts is avoided by designing for a worst case resulting DAS 100 offset (intentional plus random) to be larger than zero, i.e. |Vos nom|−|Vos rand|>0. For example, looking at the embodiment of FIG. 1, where SH 102 is also used as a DAC based on a charge redistribution principle, an offset is introduced by charging a fraction of the sampling capacitor with a controlled reference voltage ($V_{REFp}$ or $V_{REFn}$) instead of with the input voltage. If Vref is the constant voltage and VIN is the input voltage and Cs is the total sampling capacitance and A is the allocated fraction of the capacitance to be used for offset, then the total charge, Qs, that is sampled is given by:

$$Qs = Vref*A*Cs + Vin*(1-A)*Cs$$

If this charge Qs is used further in the successive approximation conversion the resulting offset referred at the input will be:

$$Vos = Vref*A/(1-A)$$

The effective area term "A" can be controlled very well in silicon implementation because it is a ratio of on-chip capacitors and if Vref is a constant voltage the offset introduced in this way is well controlled too.

In the case of the block diagram of FIG. 3 the offset may be introduced in DAC 250 as a DAC offset. A DAC offset can be introduced in many ways. In one implementation the DAC has an extended output range and the offset is introduced as a digital offset (i.e. the data input of the DAC is the result of adding the control input and a constant digital number) or as an analog offset (e.g. for a capacitive DAC the offset is introduced analogous to what was described for the SH case; for a resistive DAC, the offset is introduced by changing the values of the resistive mesh or by adding extra resistors to affect the DAC output; for a current DAC, extra current sources are aggregated at the DAC output to account for the offset).

Figure 9A:
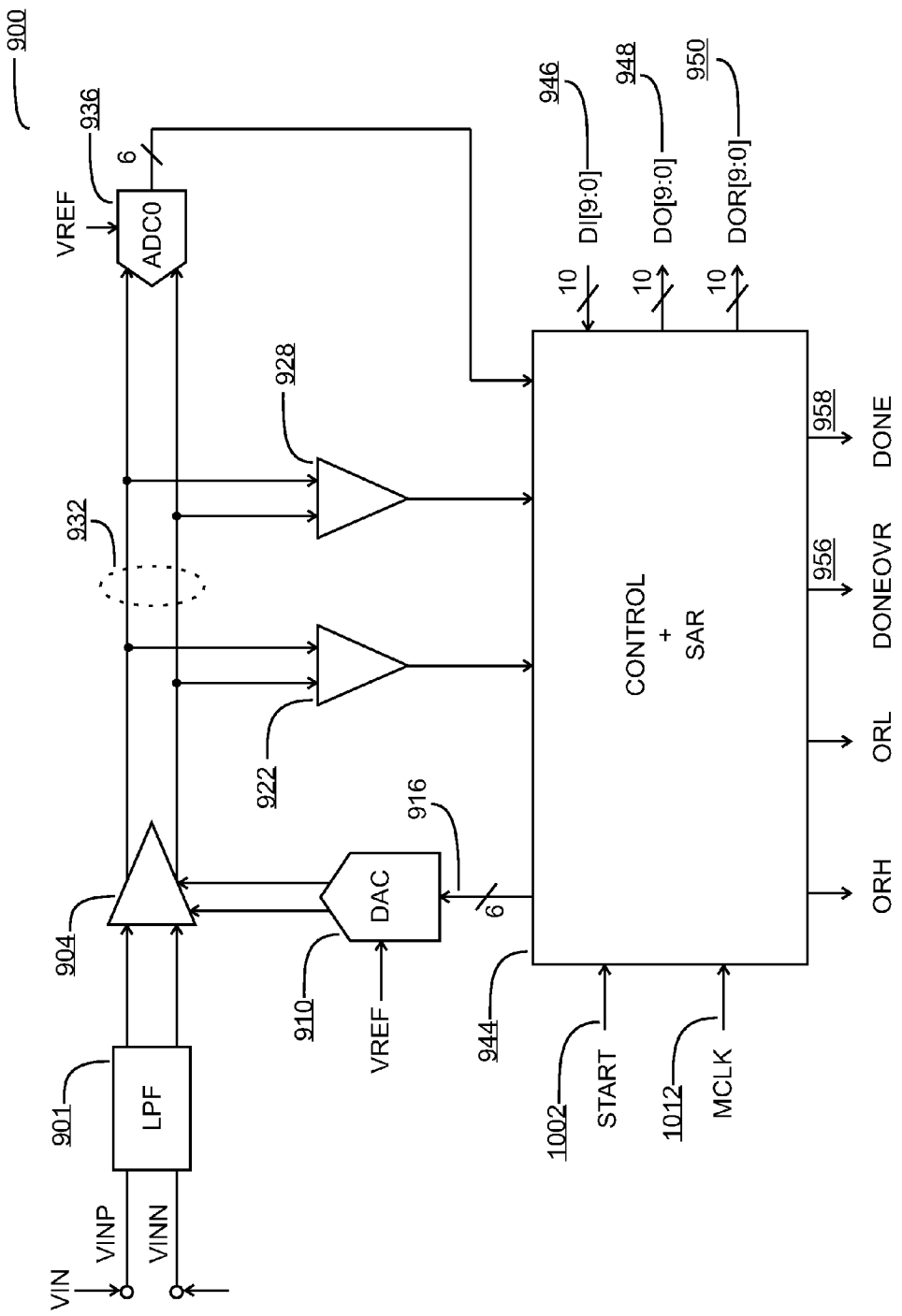
FIG. 9A is another implementation of the DAS.

Referring to FIG. 9A, in another embodiment of the present invention a six-bit DAC 910 is presented on input bus 916 with a 6-bit digital representation of the predicted value for the next conversion of Vin. The REG (not shown) provides a ten-bit value to control block 944 on lines DI[9:0] 946. The six MSB (DI[9:4]) are loaded into DAC 910 by control block 944 via the six-bit bus 916. A variable-gain stage amplifier 904 generates an analog signal 932 representing the difference between, and amplifies the difference or "residue" between the input voltage Vin and the DAC 910 output. A low pass filter LPF 901 filters out any high frequency noise on Vin before Vin is presented to amplifier 904. The output of amplifier 904 is connected with a window comparator formed of threshold detectors, 928 and 922, and with an analog to digital converter ADC0 936 by way of differential lines 932. In this part of the operation, the variable gain of amplifier 904 is set to approximately six. Amplifier 904 is allowed to settle for two clock cycles, i.e. two MCLK cycles, after which the analog residue signal it produces on lines 932 is presented to the window comparator 922-928 to determine whether the difference between the actual value of Vin and the guess 916 is within a predefined range. Detector 922 may be configured to detect when the residue is below the predefined range, and detector 928 may be configured to detect when the residue is above the predefined range. In response, the controller 944 determines whether the residue is in or out of range. In one embodiment, the controller 944 in essence makes a decision if the output of amplifier 904 is within or outside of the range given by:

$$V_{GAIN} = \pm 6 * \left( V_{IN} - \frac{DI[9:4]*FS}{64} \right),$$

where
  $V_{GAIN}$ is the voltage output of amplifier 904,
  Vin is the sampled input to amplifier 904,
  and FS in this case is the maximum value of Vin in volts.

Thus the controller 944 determines whether the difference between the voltage represented only by the 6 more significant bits of DI and the actual voltage Vin is greater than a predefined range limit. If the difference (residue) appears to be within the acceptable range, then an attempt at normal conversion can follow. Otherwise, if out-of-range, an alternate conversion follows. The shortest conversion time (hence, lowest power consumed) can be attained when the value of the six MSB's (most significant bits) represented by DI[9:4] is within the acceptable range for performing the normal conversion. The maximum difference between the predicted (DI[9:0]) and actual value of Vin for which this would be true is illustrated by the following example:
  Full Scale=1.375 volts.
  $LSB_{10}$=(1.375)/(2^10)=0.001343 volts, where $LSB_{10}$ is the voltage increment represented by one LSB of a ten-bit conversion of the range FS.
  $LSB_6$=(1.375)/(2^6)=0.02148 volts, where $LSB_6$ is the voltage increment represented by one LSB for a six bit conversion of the range FS.
  If DI[9:0]=1101110000b (note that the lower 4 bits are zero) it represents an estimate of 880*(0.001343)=1.1816 volts. The corresponding output of the analog counterpart of DI[9:4] by DAC 910 is (110111b)*$LSB_6$=55*(0.02148) =1.1816 volts. The highest value allowed for Vin, wherein DI[9:4] represents the initial six MSB guess of the ultimately ten-bit conversion, is (1101111111b)*$LSB_{10}$=895*(0.001343)=1.2018 volts. Thus the maximum acceptable value of $V_{GAIN}$=(1.20178−1.1816)=0.1208 volts, or (0.1208/1.375)=0.088*FS. The window comparator defined by threshold detectors 928 and 922 evaluates for this range in both the positive and negative direction, thus the window size defined by the difference of thresholds of detectors 928 and 922 is approximately 0.17*FS. To allow for some margin for possible noise or mismatch between the amplifier 904 and window comparator 928-922, the window comparator in one embodiment is set to look for +$V_{GAIN}$-{−$V_{GAIN}$} to be within the smaller range of 0.14*FS.

If $V_{GAIN}$ is within the predefined acceptable range, a six-bit analog to digital converter ADC0 936, which could be an SAR type of ADC or another kind of ADC and which is connected with the output of amplifier 904 by bus 932, makes a six-bit analog to digital conversion of the amplified residue signal, for example within the next six clock cycles (one clock per bit). Once the output of amplifier 904 has been latched into ADC0 936, amplifier 904 may be temporarily powered down so as to save power until the next time amplifier 904 is needed. In one embodiment, the 6 LSB's correction signal that ADC0 (936) generates is added (with an overlap of its 2 upper bit positions) to 6 MSB's guess signal (on line 916 and with a counterpart overlap of the addition over the 2 lower bit positions of the digital guess signal) to thereby produce a final, 10-bit result signal (DO(9:0)) on bus 948. This result signal (948) represents the sum of the upper 6 bits of the initial guess (946)—padded to the right with 4 zeroes—and the lower 6 bits of correction value output by residue converter 936.

If $V_{GAIN}$ is outside of the specified range, then an out-of-range condition is flagged. In response, the variable gain amplifier 904 is configured to operate as a very-high gain difference amplifier whose saturating output merely indicates whether Vin (as scaled by the LPF) is greater than the analog output of DAC 910 or not. In one embodiment, one of threshold detectors 922 and 928 is reconfigured to convert the analog, greater-or-not signal of amplifier 904 into a corresponding digital signal. In an alternate embodiment, there is a third threshold detector provided (not shown) which performs this detection and conversion for the greater-or-not signal of amplifier 904 and supplies it to controller 944. The digitized, greater-or-not signal is then used in conjunction with DAC 910 and a SAR register (not shown) in control block 944 that drives bus 916, to resolve the value of Vin to a resolution of 5 or 6 more-significant bits (MSB'). A conventional binary search algorithm may be used for generating this crude 5-6 bit digital evaluation of Vin with amplifier 904 essentially operating as a digital output comparator. The produced, 5 or 6 bit digital signal (on bus 916) then becomes the new guess signal in place of the initial guess signal supplied on bus 946 as DI(9:4). In one embodiment, the conventional, SAR algorithm is able to obtain a value for Vin with five-bit resolution in the next three MCLK clock cycles (0.5 clock per bit) after the out-of-range condition is flagged. This conversion is denominated "coarse conversion". The coarse result is immediately available to DAC 910 on bus 916 for the next clock cycle. Thus this step has formed a new five-bit approximation of Vin, which is now used in the same manner as was the first estimate supplied by the REG via bus 946. Amplifier 904 is returned to its lower gain, linear mode of operation and once again used to amplify the new residue (between Vin and the output of DAC 910) and is allowed to settle for two clock cycles. As before, the six-bit digital representation of the residue as output by ADC0 (936) is combined with the six coarse MSBs on bus 916 to provide ten bits of overall resolution for the digital representation of Vin. The total power dissipation due to this mode can be relaxed, since this case should happen infrequently, depending upon the relative accuracy of the estimates being provided by the REG.

In one embodiment of the present invention a pipelined architecture is used. Conversions wherein $\pm V_{GAIN}$ is within 0.14*FS are termed "normal" conversions. The opposite case is termed an "out of range" conversion. The pipeline is in three stages:

Stage 1 Front end setup

Stage 2 Sample input voltage and decide if VGAIN of the residue is within the window of 0.14*FS. If not, make a six-bit coarse conversion of Vin.

Stage 3 Perform analog to digital conversion of the residue, form ten-bit result, and provide the result back to the REG.

These three stages are sequential for any given Vin sample conversion (the latency of an instant conversion is equal to their sum), but they are overlapping for a series of conversions.

Figures 12A, 12B, 12C:
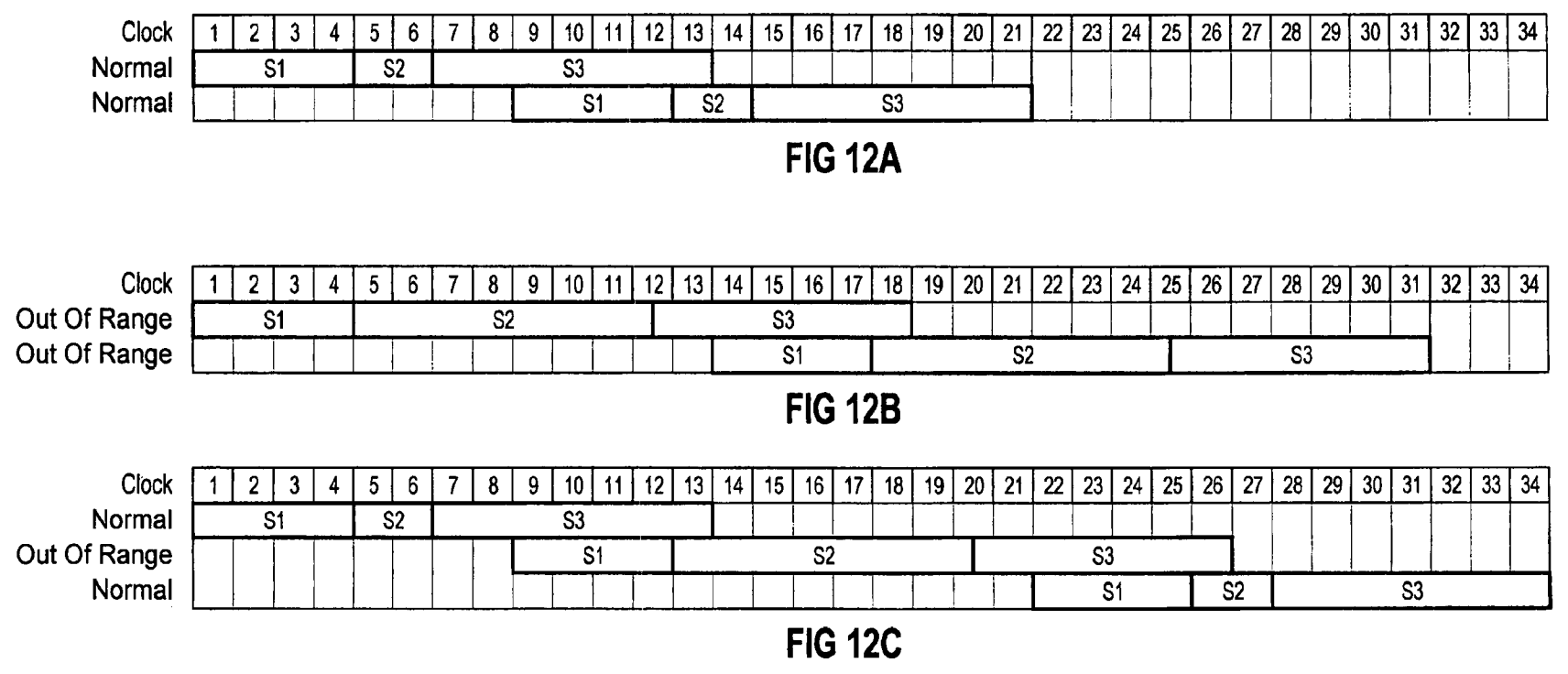

FIGS. 12A-12C illustrate the relationship between the pipelined phases for a series of conversion having stages S1, S2 and S3. FIG. 12A shows two normal conversions with the minimum time between samples of 8*MCLK. FIG. 12B shows two out of range conversions. Due to the extra 5*MCLK clocks required for the coarse conversion of Vin, these conversions may only repeat every 13*MCLK. FIG. 12C shows a sequence of normal/out of range/normal conversions. Sampling of Vin for the second normal conversion is 13*MLCK after the previous out of range conversion, but the next following sample would require a delay of only 8*MCLK clocks (clock 34).

Figure 9B:
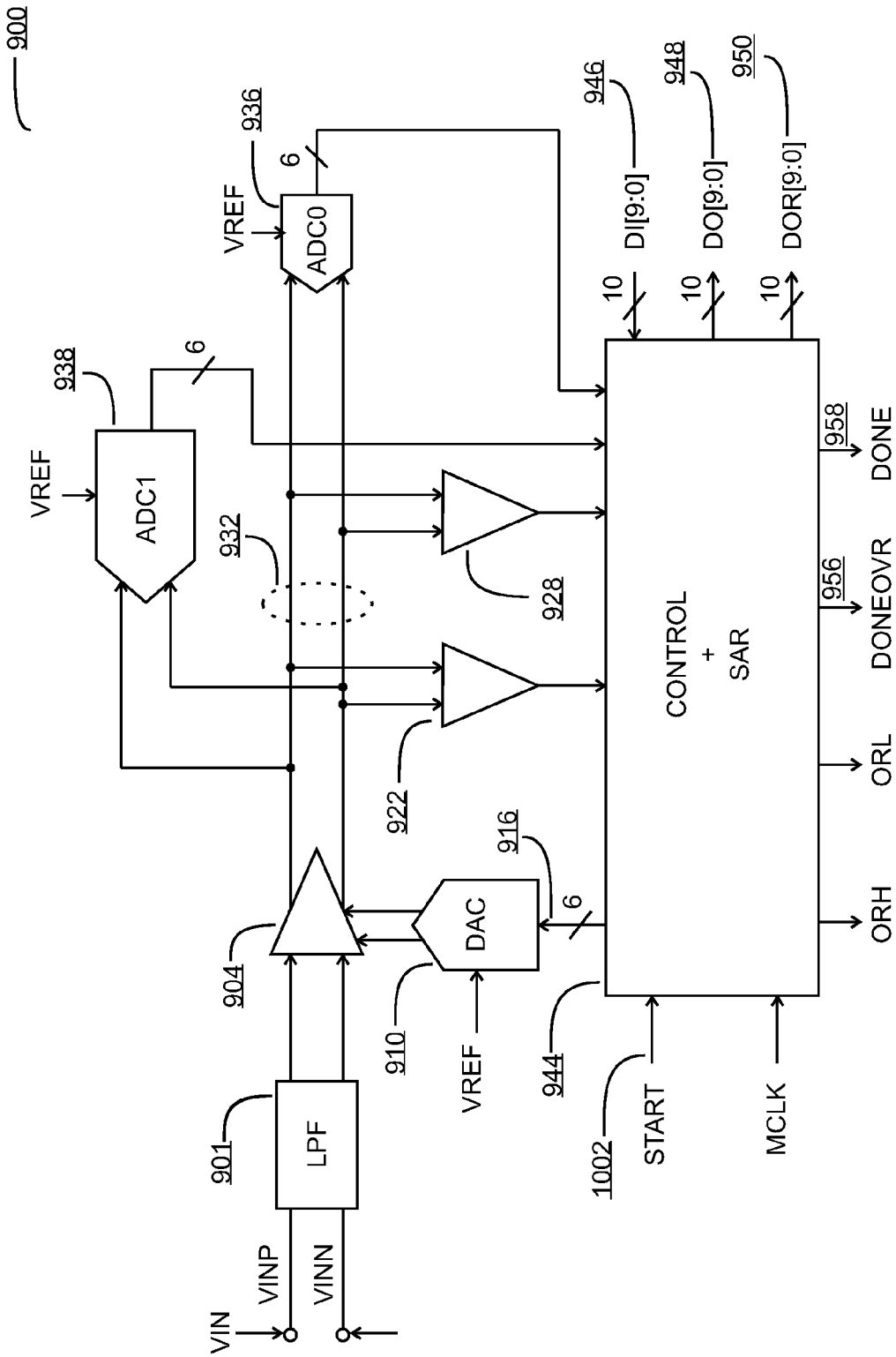
FIG. 9B is an implementation of the DAS of FIG. 9A with an additional A to D converter for overlappingly converting residue signals.
Figure 10:
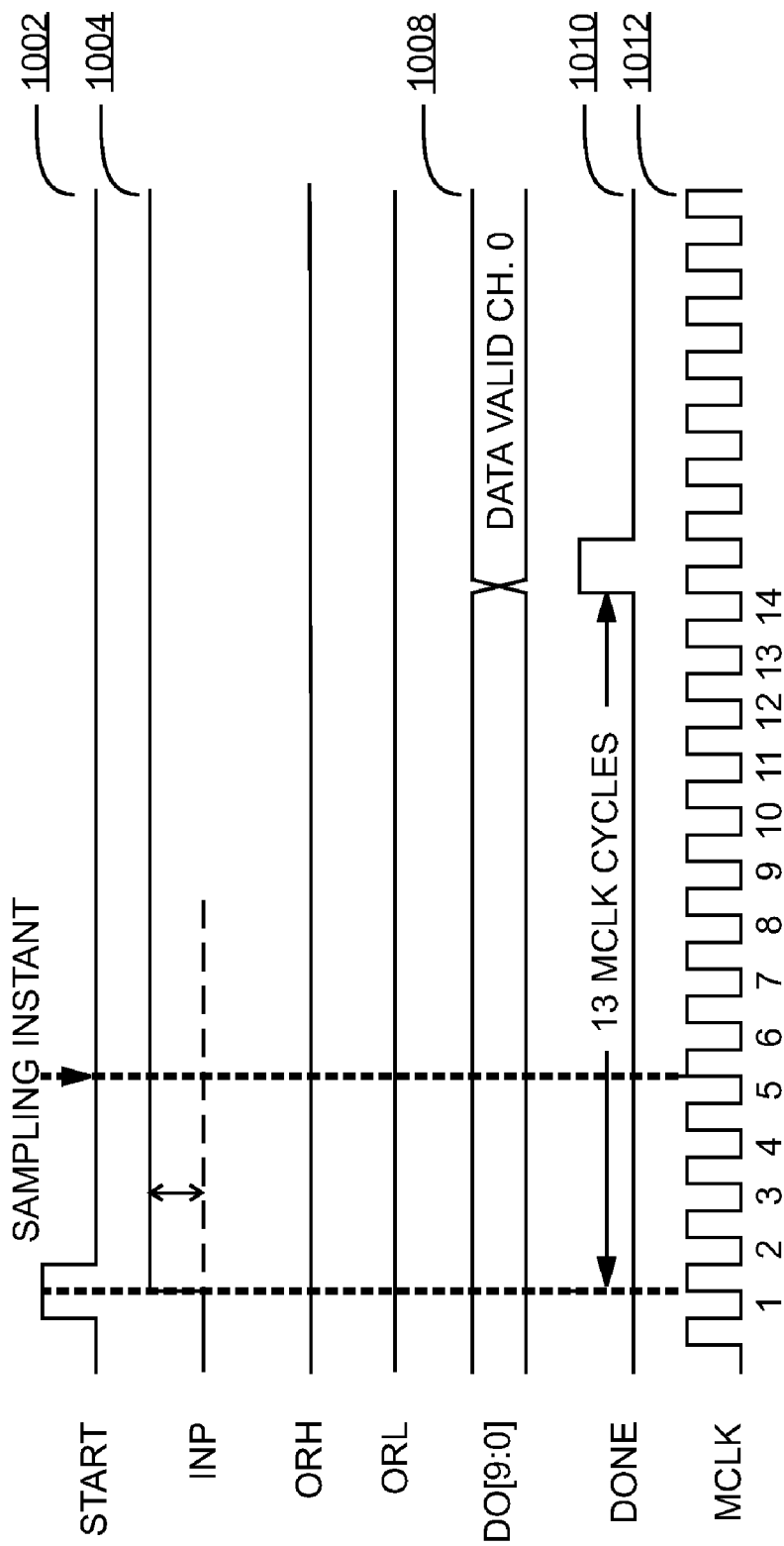
FIG. 10 is a timing diagram of an A to D conversion of FIG. 9A.

FIG. 10 details the timing diagram of a normal conversion cycle for the embodiment of FIG. 9. START signal 1002 begins each conversion request from the REG. INP step 1004 indicates the level of the input analog voltage Vin. In one embodiment this signal is connected with a single voltage source. In another embodiment INP 1004 is connected through an analog MUX to allow sampling of multiple analog sources. For a normal conversion, the out-of-range indicating signals, ORH (out of range high) and ORL (out of range low) remain unasserted. DO[9:0] 1008 is the ten-bit conversion result provided back to the REG. DONE 1010 indicates that the conversion is complete and the data on DO[9:0] is valid. MCLK 1012 is the system clock. In one embodiment conversions are provided for samples taken every 240 nSec. As can be seen this is accomplished in 8 MCLK cycles, thus a clock of 2^25, or 33.6 MHz is used, with a clock period of 238.4 nSec.

The action pertinent to each clock cycle is given in Table 4.

TABLE 4

| Clock | Activity |
| --- | --- |
| 1-5 | Input LPF 901 settles |
| 3-4.5 | Power up amplifier 904 and DAC 910 and ADCs 936 and 938. |
| 5 | Sample output of LPF 901. Settle residue into normal mode ADC0 936 and window comparator 922. |
| 7 | Strobe window comparator 922 to determine if residue is within or out of range 0.14*FS. ADC0 936 samples residue. |
| 7-8 | Residue is within range so ORH and ORL are not set. Conversion by ADC0 936 initiated. Power down amplifier 904 and DAC 910. |
| 8 | LSB5 of ADC0 known. |
| 9 | LSB4 of ADC0 known. |
| 10 | LSB3 of ADC0 known. |
| 11 | LSB2 of ADC0 known. |
| 11.5-12.5 | Power up amplifier 904 and DAC 910. |
| 12 | LSB1 of ADC0 known. |
| 13 | LSB0 of ADC0 known. LPF 901 sampled for next conversion. |
| 14 | Data valid on DO[9:0]. DONE 1010 goes high for one MCLK cycle. |

Figure 11:
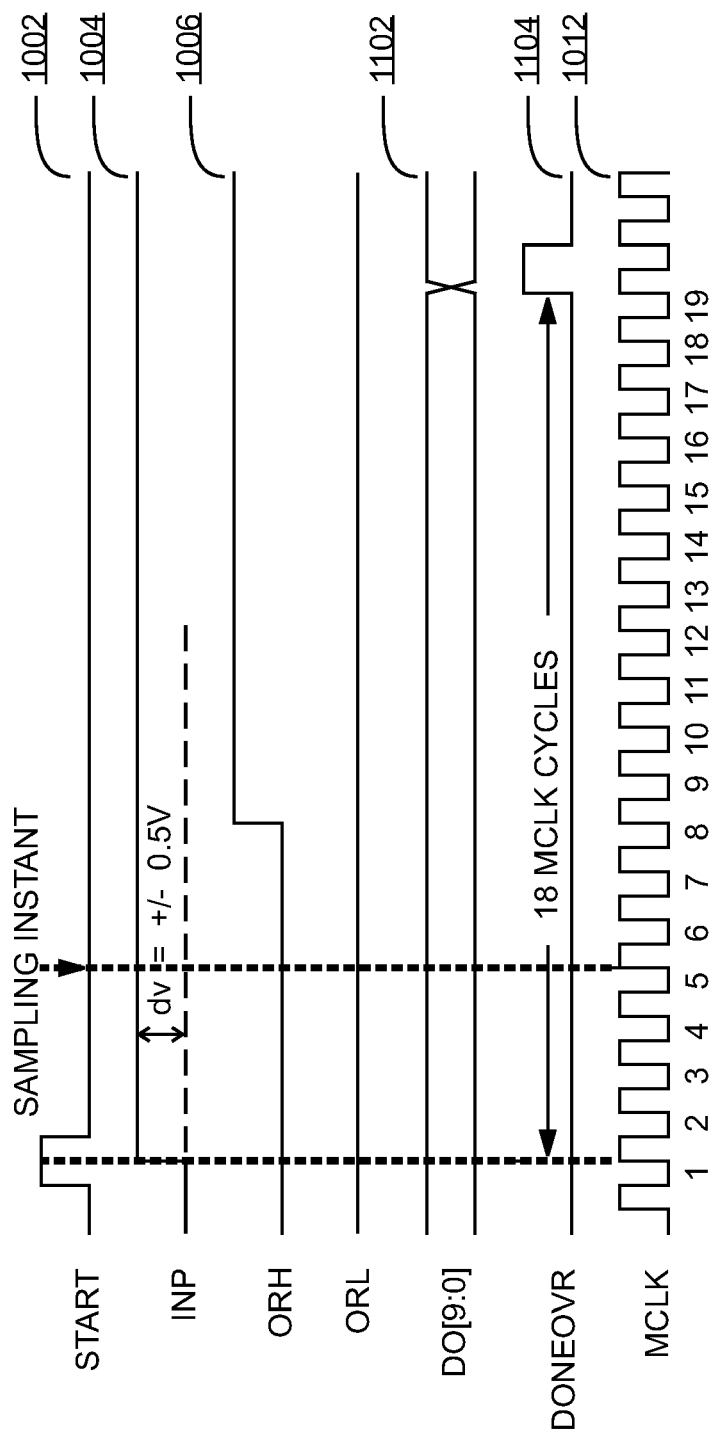
FIG. 11 is a timing diagram of an out of range conversion.

FIG. 11 is the timing diagram for an out of range conversion for the embodiment of FIG. 9. Signals in common with a normal conversion are numbered the same and need not be described. Either ORH or ORL, depending upon the value of Vin relative to DI[9:4], will be TRUE to signify to the REG the sign of the error. For the purpose of illustration ORH is shown to be the case. DOR[9:0] 1102 is the result of the ten-bit analog to digital conversion. DONEOR 1104 indicates that the data on DOR[9:0] is valid. The action pertinent to each cycle is shown in Table 5.

TABLE 5

| Clock | Activity |
| --- | --- |
| 1-5 | Input LPF 901 settles |
| 3-4.5 | Power up amplifier 904, DAC 910 and ADC0 936. |
| 5 | Sample output of LPF 901. Settle residue into normal mode ADC0 936 and window comparator 922. |

TABLE 5-continued

| Clock | Activity |
|---|---|
| 7 | Strobe window comparator 922 to determine if residue is within or out of range 0.14*FS. Normal mode ADC0 936 samples residue. |
| 7-8 | Residue is out of range (high for this example) so ORH is set. Amplifier 904 configured as open loop preamp for comparator 928. Configure DAC 910 to perform MSB tests as SAR using result register in control block 944. |
| 8 | ORH goes high. MSB5 of the coarse conversion is known. |
| 8.5 | MSB4 of the coarse conversion is known. |
| 9 | MSB3 of the coarse conversion is known. Power up LPF 901 sampling bias. |
| 9.5 | MSB2 of the coarse conversion is known. |
| 10 | MSB1 of the coarse conversion is known. |
| 10.5 | MSBO of the coarse conversion is known. |
| 10.5-12.5 | Reconfigure amplifier 904 as a linear amplifier and settle amplified residue $V_{GAIN}$ (note that DAC 910 output is a reconstruction of the just determined 5 MSBs from the coarse conversion) into ADC0 936. |
| 12.5 | ADC0 936 samples $V_{GAIN}$. |
| 12.5-13 | Autozero amplifier 904. |
| 13.5 | LSB5 of ADC0 known. |
| 14.5 | LSB4 of ADC0 known. |
| 15.5 | LSB3 of ADC0 known. |
| 16.5 | LSB2 of ADC0 known. |
| 17.5 | LSB1 of ADC0 known. |
| 18 | Sample output of LPF 901. |
| 18.5 | LSBO of ADC0 known. |
| 19 | Resulting data written to DOR[9:0] DONEOR goes high for one MCLK cycle. |

In another embodiment 900' a second analog to digital converter is added: ADC1 938 in FIG. 9B. ADC1 938 is connected with the output of amplifier 904 via bus 932, in parallel with ADC0 936. Each of ADC0 936 and ADC1 938 of FIG. 9B has a sample and hold means at its front end. This allows for two functions. First, it allows temporary powering down of the difference-finding amplifier 904 after it has generated a residue or difference signal. Second, it allows for temporal overlapping of A/D conversion operations by ADC0 936 and ADC1 938. Thus, in one embodiment, ADC1 938 is used when an out of range conversion occurs. ADC1 938 performs the six-bit conversion of the residue on bus 932 after the coarse conversion had been completed. This frees up ADC0 936 to receive a next residue from amplifier 904 while ADC1 938 is performing an independent conversion of the instant residue. The result is that an out of range conversion has greater latency than a normal conversion, but samples can continuously be taken every 8*MCLK. This improves the average throughput of the DAS, and also supplies the REG with data that is known to correspond to samples taken at regular intervals.

Figures 13A, 13B:
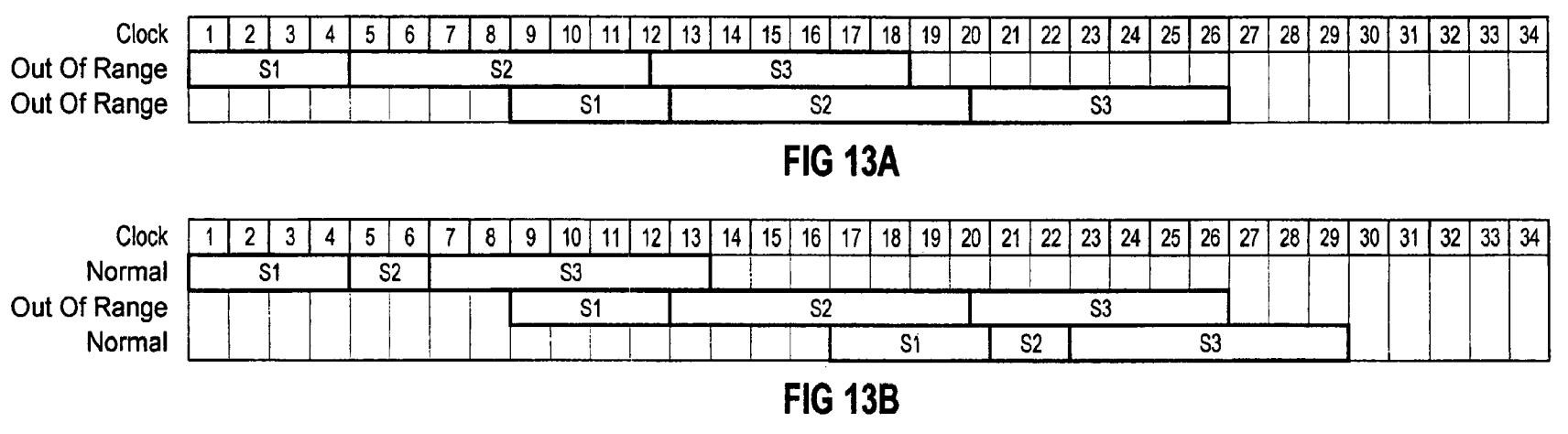

FIG. 13 illustrates the timing of a pipelined architecture. FIG. 13A shows two out of range conversions. The second of these conversions is completed earlier than that of the second conversion shown in FIG. 12B because the Vin sample is taken at 13*MLCK instead of at 18*MLCK. FIG. 13B details the pipelining of a normal/out of range/normal sequence and may be compared to FIG. 12C. Here we see data being sent to REG at varying times (MCLK clocks 12, 27, and 30) but the data represents samples from uniform time intervals (MCLK clocks 5,13, and 21). A normal/normal conversion is not shown in FIG. 13 because it would be identical to that of FIG. 12A. Therefore Table 4 details are correct for this embodiment as well. Table 6 details the time of this embodiment for an out of range conversion.

TABLE 6

| Clock | Activity |
|---|---|
| 1-5 | Input LPF 901 settles |
| 3-4.5 | Power up amplifier 904 and DAC 910 and ADCs 936 and 938. |
| 4.5-5 | Autozero amplifier 904. |
| 5 | Sample output of LPF 901. Settle residue into normal mode ADC0 936 and window comparator 922. |
| 7 | Strobe window comparator 922 to determine if residue is within or out of range .14*FS. Normal mode ADC0 936 samples residue. |
| 7-8 | Residue is out of range (high for this example) so ORH is set. Amplifier 904 configured as open loop preamp for comparator 928. Configure DAC 910 to perform MSB tests as SAR using result register in control block 944. Power up ADC1 938. |
| 8 | ORH goes high. MSB5 of the coarse conversion is known. |
| 8.5 | MSB4 of the coarse conversion is known. |
| 9 | MSB3 of the coarse conversion is known. Power up LPF 901 sampling bias. |
| 9.5 | MSB2 of the coarse conversion is known. |
| 10 | MSB1 of the coarse conversion is known. |
| 10.5 | MSBO of the coarse conversion is known. |
| 10.5-12.5 | Reconfigure amplifier 904 as a linear amplifier and settle amplified residue $V_{GAIN}$ (note that DAC 910 output is a reconstruction of the just determined 5 MSBs from the coarse conversion) into ADC1 938. |
| 12.5 | ADC1 938 samples $V_{GAIN}$. |
| 13 | Sample output of LPF 901. |
| 13.5 | LSB5 of ADC1 known. |
| 14.5 | LSB4 of ADC1 known. |
| 15.5 | LSB3 of ADC1 known. |
| 16.5 | LSB2 of ADC1 known. |
| 17.5 | LSB1 of ADC1 known. |
| 18.5 | LSBO of ADC1 known. |
| 19 | Resulting data written to DONEOR[9:0] DONEOR goes high for one MCLK cycle. ADC1 938 powered down. |

One skilled in the art will recognize from the above that the method of the current invention can be extended to any number of different analog-to-digital conversion units. The analog to digital conversion may have a resolution of more or fewer bits. The number of LSBs which are allowed to differ from the starting estimate for a normal mode conversion may be more or fewer, depending upon the stability or rate of change of Vin and the sample frequency.

Accordingly, the present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A method of advancing a guessed magnitude towards convergence with an actual magnitude of a physical attribute based on comparison of the guessed magnitude against the actual magnitude, the method comprising:
   (a) receiving a signal representing an initial guessed magnitude;
   (b) first determining from comparison of the initial guessed magnitude against the actual magnitude, if the initial guessed magnitude is above the actual magnitude or not;
   (c) if said first determining indicates that the initial guessed magnitude is above, first changing the guessed magnitude by decrementing the guessed magnitude by a first step amount; and
   (d) if said first determining indicates that the initial guessed magnitude is not above, first changing the guessed magnitude by incrementing the guessed magnitude by a second step amount.

2. The guess advancing method of claim 1 and further comprising:
   (e) second determining from comparison of the first changed guessed magnitude with the actual magnitude, whether a change has occurred in the above-or-not relationship between the guessed and actual magnitudes as determined by said first determining step (c);
   (f) if said second determining indicates that the guessed magnitude is still above, second changing the guessed magnitude by decrementing the guessed magnitude by a third step amount;
   (g) if said second determining indicates that the guessed magnitude is still not above, second changing the guessed magnitude by incrementing the guessed magnitude by a fourth step amount; and
   (h) if said second determining indicates that a change has occurred in the above-or-not relationship between the guessed and actual magnitudes as determined by said second determining step (f), reversing the direction of change and second changing the guessed magnitude by a step amount having an absolute magnitude less than the corresponding one of the first and second step amounts that resulted in said occurrence of change in the above-or-not relationship between the guessed and actual magnitudes.

3. The guess advancing method of claim 2 and further comprising:
   (i) third determining from comparison of the second changed guessed magnitude with the actual magnitude, whether a change has occurred in the above-or-not relationship between the guessed and actual magnitudes as determined by said second determining step (e);
   (j) if said third determining indicates that the guessed magnitude is still above, third changing the guessed magnitude by decrementing the guessed magnitude by a fifth step amount;
   (k) if said third determining indicates that the guessed magnitude is still not above, third changing the guessed magnitude by incrementing the guessed magnitude by a sixth step amount; and
   (l) if said third determining indicates that a change has occurred in the above-or-not relationship between the guessed and actual magnitudes as determined by said third determining step (i), reversing the direction of change and third changing the guessed magnitude by a step amount having an absolute magnitude less than the corresponding one of the third and fourth step amounts that resulted in said occurrence of change in the above-or-not relationship between the guessed and actual magnitudes as determined by said third determining step (i).

4. The guess advancing method of claim 3 wherein said fifth and sixth step amounts differ from one another.

5. The guess advancing method of claim 3 wherein said third and fourth step amounts differ from one another.

6. The guess advancing method of claim 3 wherein said first and second step amounts differ from one another.

7. The guess advancing method of claim 2 wherein said third and fourth step amounts differ from one another.

8. The guess advancing method of claim 2 wherein said first and second step amounts differ from one another.

9. The guess advancing method of claim 2 and further comprising:
   (i) halting changing of said guessed magnitude by the guess advancing method if a predetermined number of changes of the guessed magnitude does not result in detection of a change occurring in the above-or-not relationship between the guessed and actual magnitudes.

10. A method of reducing difference between a guessed magnitude and an actual magnitude of a physical attribute, the method comprising:
    (a) receiving a first digital guess signal representing an initial guessed magnitude for the physical attribute;
    (b) first determining from comparison of an analog version of the first digital guess signal against an analog signal representing the actual magnitude, at least if the initial guessed magnitude is above the actual magnitude or not; and
    (c) second determining whether difference between the initial guessed magnitude and the actual magnitude is within a defined first error bound, where said defined error bound is less than one half of a full scale range of resolution of a digital result signal to be output as representing the actual magnitude of the physical attribute to a predefined degree of digital resolution.

11. The difference reducing method of claim 10 and further comprising:
    (d) if said second determining step (c) indicates that the difference between the initial guessed magnitude and the actual magnitude is less than or equal to the defined first error bound, continuing with a first preestablished algorithm for reducing the difference between the initial guessed magnitude and the actual magnitude; and (e) if said second determining step (c) indicates that the difference between the initial guessed magnitude and the actual magnitude is greater than the defined first error bound, discontinuing the first preestablished algorithm and switching to a preestablished alternate algorithm for generating said digital result signal as a representative of the actual magnitude of the physical attribute to said predefined degree of digital resolution.

12. The difference reducing method of claim 11 and further comprising:

(f) as a continuance of said first preestablished algorithm, modifying the digital guess signal by an amount representing less than said defined first error bound.

13. The difference reducing method of claim 12 and further comprising:

(g) as a continuance of said first preestablished algorithm and after modifying the digital guess signal by said amount less than said defined first error bound, determining whether difference between the modified guessed magnitude and the actual magnitude is within a defined second error bound, where said defined second error bound is less than the defined first error bound.

14. A system of reducing difference between a guessed magnitude and an actual magnitude of a physical attribute, the system comprising:

(a) receiving means for receiving a first digital guess signal representing an initial guessed magnitude for the physical attribute;

(b) first determining means for determining by comparison of an analog version of the first digital guess signal against an analog signal representing the actual magnitude, at least if the initial guessed magnitude is above the actual magnitude or not; and (c) second determining means for determining whether difference between the initial guessed magnitude and the actual magnitude is within a defined first error bound, where said defined error bound is less than one half of a full scale range of resolution of a digital result signal to be output as representing the actual magnitude of the physical attribute to a predefined degree of digital resolution.

15. The difference reducing system of claim 14 and further comprising:

(d.1) third determining means responsive to said second determining means such that if the second determining means (c) indicates that the difference between the initial guessed magnitude and the actual magnitude is less than or equal to the defined first error bound, the third determining means causes a continuing of a first preestablished algorithm for reducing the difference between the initial guessed magnitude and the actual magnitude, and (d.2) if said second determining means (c) indicates that the difference between the initial guessed magnitude and the actual magnitude is greater than the defined first error bound, the third determining means causes a discontinuing of the first preestablished algorithm and a switching to a preestablished alternate algorithm for generating said digital result signal as a representative of the actual magnitude of the physical attribute to said predefined degree of digital resolution.

* * * * *